(12) United States Patent
Park et al.

(10) Patent No.: US 12,057,323 B2
(45) Date of Patent: Aug. 6, 2024

(54) SUBSTRATE PROCESSING METHOD, MICROPATTERN FORMING METHOD, AND SUBSTRATE PROCESSING APPARATUS

(71) Applicant: SAMSUNG ELECTRONICS CO., LTD., Suwon-si (KR)

(72) Inventors: Sangjine Park, Suwon-si (KR); Seohyun Kim, Hwaseong-si (KR); Sukhoon Kim, Seongnam-si (KR); Jihoon Jeong, Seongnam-si (KR); Younghoo Kim, Yongin-si (KR); Kuntack Lee, Suwon-si (KR)

(73) Assignee: SAMSUNG ELECTRONICS CO., LTD. (KR)

( * ) Notice: Subject to any disclaimer, the term of this patent is extended or adjusted under 35 U.S.C. 154(b) by 294 days.

(21) Appl. No.: 17/559,766

(22) Filed: Dec. 22, 2021

(65) Prior Publication Data

US 2022/0208558 A1    Jun. 30, 2022

(30) Foreign Application Priority Data

Dec. 29, 2020  (KR) .................. 10-2020-0186782

(51) Int. Cl.
*H01L 21/3213*  (2006.01)
*G03F 7/20*  (2006.01)
*G03F 7/30*  (2006.01)
*G03F 7/32*  (2006.01)
*H01L 21/308*  (2006.01)
*H01L 21/311*  (2006.01)

(52) U.S. Cl.
CPC ...... *H01L 21/32139* (2013.01); *G03F 7/2004* (2013.01); *G03F 7/3021* (2013.01); *G03F 7/325* (2013.01); *H01L 21/308* (2013.01); *H01L 21/31144* (2013.01)

(58) Field of Classification Search
None
See application file for complete search history.

(56) References Cited

U.S. PATENT DOCUMENTS

| | | | |
|---|---|---|---|
| 6,358,673 B1 | 3/2002 | Namatsu | |
| 7,944,025 B2* | 5/2011 | Doan | G03F 7/322 257/618 |
| 8,137,576 B2 | 3/2012 | Harumoto et al. | |
| 8,898,926 B2 | 12/2014 | Cho et al. | |
| 2008/0203058 A1* | 8/2008 | Harumoto | G03F 7/32 156/345.11 |
| 2012/0251943 A1* | 10/2012 | Rahman | G03F 7/091 430/311 |
| 2013/0167399 A1 | 7/2013 | Lee | |
| 2018/0373154 A1 | 12/2018 | Choi et al. | |
| 2020/0081347 A1 | 3/2020 | Choi et al. | |
| 2020/0152486 A1 | 5/2020 | Kim et al. | |

FOREIGN PATENT DOCUMENTS

| | | | |
|---|---|---|---|
| JP | 2006066698 A | 3/2006 | |
| KR | 100822373 B1 | 4/2008 | |
| KR | 20200095218 A | 8/2020 | |

* cited by examiner

*Primary Examiner* — Jiong-Ping Lu
(74) *Attorney, Agent, or Firm* — Myers Bigel, P.A.

(57) ABSTRACT

A substrate processing method includes providing a surface tension reducing agent as a gas onto a substrate, the substrate having an exposed photoresist layer and layer of developer on the exposed photoresist layer, and causing a bulk flow of the developer in order to remove the developer from the substrate.

17 Claims, 21 Drawing Sheets

SUBSTRATE PROCESSING METHOD, MICROPATTERN FORMING METHOD, AND SUBSTRATE PROCESSING APPARATUS

CROSS-REFERENCE TO RELATED APPLICATION

This application is based on and claims priority under 35 U. S. C. § 119 to Korean Patent Application No. 10-2020-0186782, filed on Dec. 29, 2020, in the Korean Intellectual Property Office, the disclosure of which is incorporated by reference herein in its entirety.

BACKGROUND

The inventive concept relates to a substrate processing method, a micropattern forming method, and a substrate processing apparatus, and more particularly, to a substrate processing method, a micropattern forming method, and a substrate processing apparatus capable of forming a micropattern having a smooth pattern surface without embossing, and having reduced particle defects with less risk of collapse.

Supercritical fluids have been used during micropattern forming to reduce the risk of microphotoresist pattern collapse. Unfortunately, there are problems associated with the use of supercritical fluids, such as the occurrence of particle defects.

SUMMARY

The inventive concept relates to a substrate processing method capable of forming a micropattern having a smooth pattern surface without embossing and with reduced particle defects and less risk of collapse.

The inventive concept relates to a micropattern forming method capable of forming a micropattern having a smooth pattern surface without embossing and with reduced particle defects and less risk of collapse.

The inventive concept relates to a substrate processing apparatus capable of forming a micropattern having a smooth pattern surface without embossing and with reduced particle defects and less risk of collapse.

According to an aspect of the inventive concept, there is provided a substrate processing method including providing a surface tension reducing agent as a gas onto a substrate, the substrate having an exposed photoresist layer and a layer of developer on the exposed photoresist layer, and causing bulk flow of the developer to remove the developer from the substrate.

According to an aspect of the inventive concept, there is provided a substrate processing method including providing a surface tension reducing agent as a gas onto developer in a processing chamber, dipping a substrate having an exposed photoresist layer in the developer, and removing the substrate from the developer such that a main surface of the substrate is perpendicular to a free surface of the developer.

According to an aspect of the inventive concept, there is provided a micropattern forming method including forming a to-be-etched layer and an antireflection layer on a substrate, forming an extreme ultraviolet (EUV) photoresist layer on the substrate, exposing the EUV photoresist layer to EUV irradiation using an exposure mask, providing a layer of developer onto the exposed EUV photoresist layer and moving the substrate into a processing chamber, providing a surface tension reducing agent as a gas into the processing chamber, causing a bulk flow of the developer to remove the developer from the substrate and to form a photoresist pattern, opening a discharge port of the processing chamber and discharging the developer from the substrate, transferring the substrate into an etching chamber, and etching the to-be-etched layer using the photoresist pattern as an etching mask.

According to an aspect of the inventive concept, there is provided a substrate processing apparatus including a processing chamber including an internal space and a substrate support within the internal space, a surface tension reducing agent supply system configured to supply a surface tension reducing agent as a gas to the processing chamber, and a controller configured to control the supply of the surface tension reducing agent via the surface tension reducing agent supply system. The surface tension reducing agent supply system includes at least one supply port configured to supply the surface tension reducing agent to the internal space and at least one discharge port configured to remove developer removed from the internal space.

BRIEF DESCRIPTION OF THE DRAWINGS

Embodiments of the inventive concept will be more clearly understood from the following detailed description taken in conjunction with the accompanying drawings in which.

DETAILED DESCRIPTION

Figure 1:
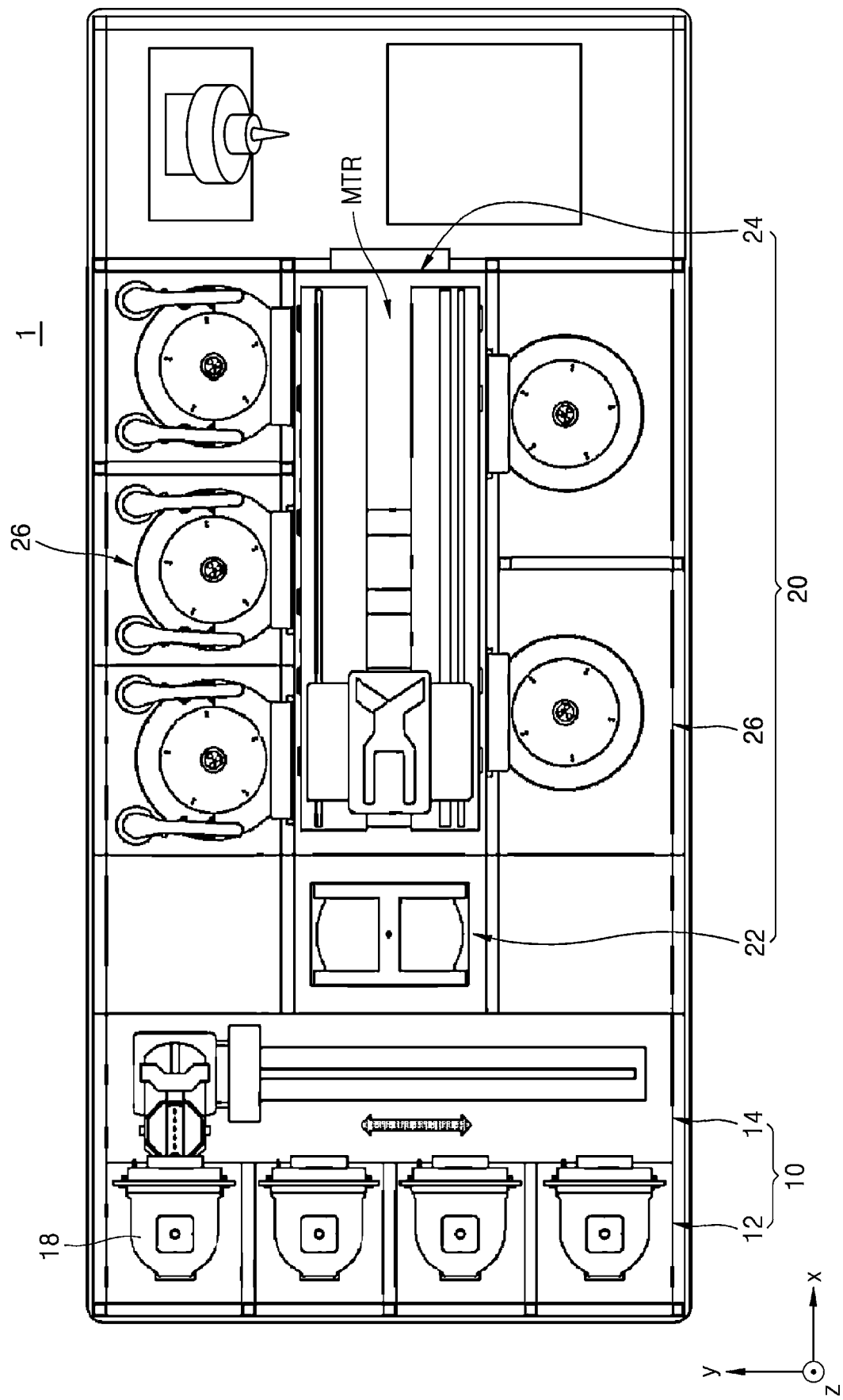
FIG. 1 is a plan view illustrating an embodiment of semiconductor manufacturing equipment.

Hereinafter, embodiments of the inventive concept will be described in detail with reference to the accompanying drawings. Like reference numerals refer to like elements throughout.

FIG. 1 is a plan view illustrating an embodiment of semiconductor manufacturing equipment 1.

Referring to FIG. 1, the semiconductor manufacturing equipment 1 may include an index module 10 and a process processing module 20. The index module 10 may include loading ports 12 and a transfer frame 14. In some embodiments, the loading ports 12, the transfer frame 14, and the process processing module 20 may be sequentially arranged in line.

Carriers 18 in which substrates are accommodated are positioned in the loading ports 12. Front opening unified pods (FOUP) may be used as the carriers 18. There may be multiple loading ports 12, as illustrated. The number of loading ports 12 may increase or decrease in accordance with process efficiency and footprint condition of the process processing module 20. A plurality of slots for accommodating substrates horizontal to the ground are formed in the carriers 18.

The process processing module 20 may include a buffer unit 22, a transfer chamber 24, and a plurality of chamber modules 26. The plurality of chamber modules 26 may be arranged on both sides of the transfer chamber 24. In some embodiments, the plurality of chamber modules 26 may be symmetrical to one another relative to the transfer chamber 24.

In some embodiments, the plurality of chamber modules 26 are provided on one side of the transfer chamber 24. Some of the plurality of chamber modules 26 may be arranged along a longitudinal direction of the transfer chamber 24. In addition, some of the plurality of chamber modules 26 may be in a stacked relationship (i.e., in adjacent, vertical relationship) with each another. For example, on one side of the transfer chamber 24, the plurality of chamber modules 26 may be arranged in an array of A×B, where A is the number of chamber modules 26 provided along the x direction and B is the number of chamber modules 26 provided along the z direction. When four or six chamber modules 26 are provided on both sides of the transfer chamber 24, the four or six chamber modules 26 may be arranged with an array of 2×2 or 3×2. The number of chamber modules 26 may increase or decrease. In some embodiments, the plurality of chamber modules 26 may be provided only on one side of the transfer chamber 24. In addition, in some embodiments, the plurality of chamber modules 26 may be provided on one side or both sides of the transfer chamber 24 in a single layer. In some embodiments, ont one side of the transfer chamber 24, an additional chamber module facing the buffer unit 222 may be provided, which will be described in more detail with reference to FIG. 2.

The buffer unit 22 is arranged between the transfer frame 14 and the transfer chamber 24. The buffer unit 22 provides a space in which a substrate stays before the substrate is returned between each of the plurality of chamber modules 26 and the carriers 18. The transfer frame 14 returns the substrate between each of the carriers 18 positioned in the loading ports 12 and the buffer unit 22.

The transfer chamber 24 may include a transfer device MTR and returns a substrate between the buffer unit 22 and each of the plurality of chamber modules 26 and between the plurality of chamber modules 26.

Figure 2:
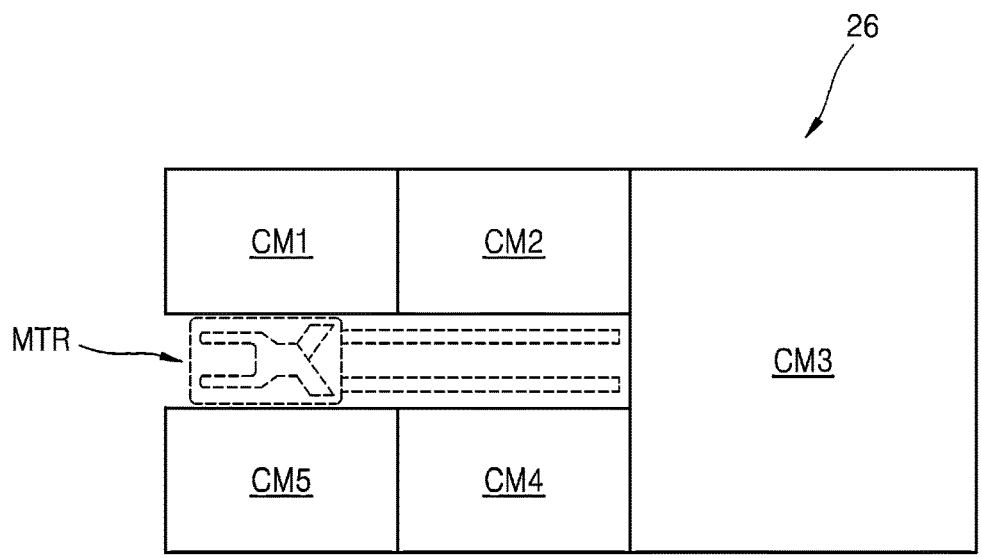
FIG. 2 is a block diagram conceptually illustrating layout of exemplary chamber modules.

FIG. 2 is a block diagram conceptually illustrating layout of exemplary chamber modules 26.

Referring to FIG. 2, the chamber modules 26 may include a first chamber module CM1 coating photoresist on a surface of a received substrate.

The substrate may be, for example, a semiconductor substrate. In some embodiments, the semiconductor substrate may include semiconductor such as silicon (Si) or germanium (Ge) or compound semiconductor such as silicon germanium (SiGe), silicon carbide (SiC), gallium arsenide (GaAs), indium arsenide (InAs), or indium phosphide (InP).

Photoresist coated on the surface of the substrate may be a photosensitive polymer material having a chemical property that changes by being exposed to extreme ultraviolet (EUV) at a wavelength of 13.5 nm or a wavelength less than 11 nm.

In some embodiments, photoresist may include, for example, (meth)acrylate polymer. (Meth)acrylate polymer may be aliphatic (meth)acrylate polymer and may include, for example, polymethylmethacrylate (PMMA), poly(t-butylmethacrylate), poly(methacrylic acid), poly(norbornyl-methacrylate), binary or terpolymer of repeating units of the above (meth)acrylate polymer components, or combinations thereof.

The photoresist may be a polymer including repeating units combined with a protecting group that may be deprotected by exposure, which will be described later. The protecting group as a functional group that may be decomposed by acid may be selected from, for example, tert-butoxycarbonyl (t-BOC), isonorbornyl, 2-methyl-2-adamantyl, 2-ethyl-2-adamantyl, 3-tetrahydrofuranyl, 3-oxocyclohexyl, γ-butyllactone-3-yl, mavaloniclactone, γ-butyrolactone-2-yl, 3-methyl-γ-butyrolactone-3-yl, 2-tetrahydropyranyl, 2-tetrahydrofuranyl, 2,3-propylenecarbonate-1-yl, 1-methoxyethyl, 1-ethoxyethyl, 1-(2-methoxyethoxy)ethyl, 1-(2-acetoxyethoxy)ethyl, t-butoxycarbonylmethyl, methoxymethyl, ethoxymethyl, trimethoxysilyl, and triethoxysilyl. However, the inventive concept is not limited thereto.

Photoresist layer may be formed by, for example, a spin coating method, a spray coating method, or a deep coating method to a thickness of, for example, about 30 nm to about 150 nm.

The chamber modules 26 may include at least one second chamber module CM2 baking the photoresist layer on the substrate. In the second chamber module CM2, the photoresist layer may be baked at a temperature of about 80° C. to about 130° C. for about 40 seconds to about 100 seconds.

The chamber modules 26 may include a third chamber module CM3 configured to irradiate EUV onto the photoresist layer on the substrate using a photo mask.

Figure 3A:
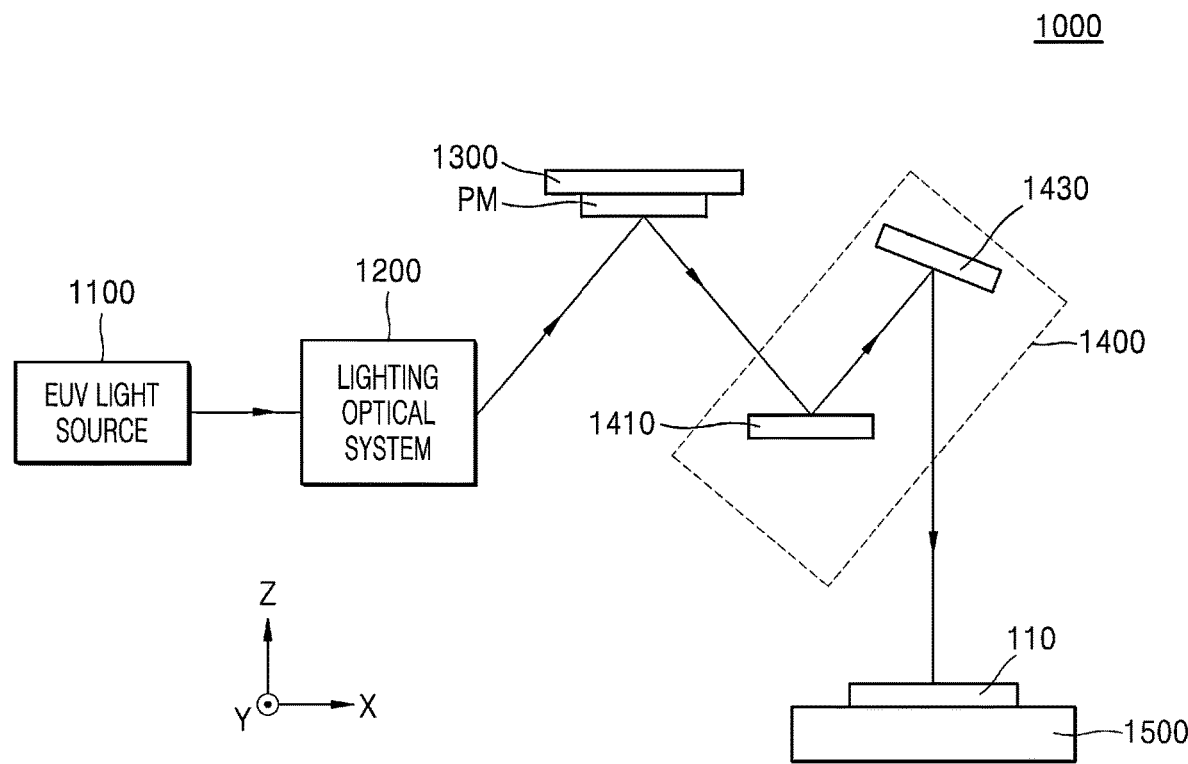
FIGS. 3A and 3B are schematic diagrams illustrating extreme ultraviolet (EUV) exposure performed on a photoresist layer on the substrate in the third chamber module.
Figure 3B:
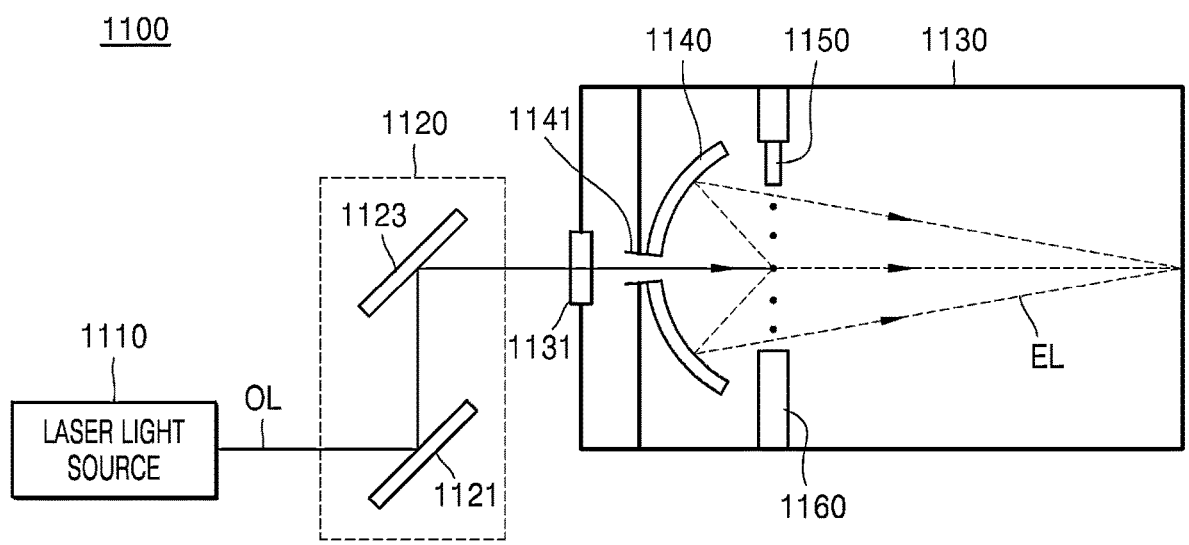

FIGS. 3A and 3B are schematic diagrams illustrating extreme ultraviolet (EUV) exposure performed on a photoresist layer on a substrate 110 in the third chamber module.

Referring to FIGS. 3A and 3B, EUV exposure equipment 1000 may include an EUV light source 1100, a lighting optical system 1200, a photomask support 1300, a projection optical system 1400, and a substrate stage 1500.

The EUV light source 1100 may generate and output EUV light EL with high energy density. For example, the EUV light EL irradiated from the EUV light source 1100 may have a wavelength of about 4 nm to about 124 nm. In some embodiments, the EUV light EL may have a wavelength of about 4 nm to about 20 nm or a wavelength of about 13.5 nm.

The EUV light source 1100 may be a plasma based light source or a synchrotron radiation light source. Here, the plasma base light source generating plasma and using light radiated by plasma may be a laser produced plasma light source or a discharge produced plasma light source.

The EUV light source 1100 may include a laser light source 1110, a transmission optical system 1120, a vacuum chamber 1130, a collector mirror 1140, a droplet generator 1150, and a droplet catcher 1160, as illustrated in FIG. 3B.

The laser light source 1110 may output a laser OL. For example, the laser light source 1110 may output a carbon dioxide ($CO_2$) laser. The laser OL output from the laser light source 1110 may be incident on a window 1131 of the vacuum chamber 1130 through a plurality of reflective mirrors 1121 and 1123 included in the transmission optical system 1120 and may be received in the vacuum chamber 1130.

An aperture 1141 that may transmit the laser OL may be formed in the center of the collector mirror 1140 and the laser OL may be received in the vacuum chamber 1130 through the aperture 1141 of the collector mirror 1140.

The droplet generator 1150 may generate a droplet generating the EUV light EL by interacting with the laser OL and may provide the droplet to the vacuum chamber 1130. The droplet may include at least one of tin (Sn), lithium (Li), and xenon (Xe). For example, the droplet may include at least one of Sn, Sn compounds (for example, $SnBr_4$, $SnBr_2$, and SnH), and Sn alloys (for example, Sn—Ga, Sn—In, and Sn—In—Ga).

The droplet catcher 1160 may be provided below the droplet generator 1150 and may catch a droplet that does not react with the laser OL. The droplet provided by the droplet generator 1150 may generate the EUV light EL by reacting with the laser OL received in the vacuum chamber 1130. The collector mirror 1140 may radiate the EUV light EL to the lighting optical system 1200 arranged outside the vacuum chamber 1130 by catching and reflecting the EUV light EL.

The lighting optical system 1200 may include a plurality of reflective mirrors and may transmit the EUV light EL radiated from the EUV light source 1100 to an EUV photomask PM (FIG. 3A). For example, the EUV light EL radiated from the EUV light source 1100 may be reflected in the plurality of reflective mirrors in the lighting optical system 1200 and may be incident on the EUV photomask PM arranged on the photomask support 1300.

The EUV photomask PM may be a reflective mask including a reflective region and a non-reflective (or medium reflective) region. The EUV photomask PM may include a reflective multilayer formed on a mask substrate including a material with a low thermal expansion coefficient such as Si and an absorption pattern formed on the reflective multilayer. Here, the reflective multilayer may correspond to the reflective region and the absorption pattern may correspond to the non-reflective (or medium reflective) region.

The EUV photomask PM reflects the EUV light EL incident through the lighting optical system 1200 and has the EUV light EL incident on the projection optical system 1400. Specifically, the EUV photomask PM structurizes (i.e., creates a pattern for) light incident from the lighting optical system 1200 to projection light and has the projection light incident on the projection optical system 1400 based on a pattern form formed by the reflective multilayer on the mask substrate and the absorption pattern. The projection light may be structurized by the EUV photomask PM through at least second diffraction order. The projection light may be incident on the projection optical system 1400 with information on the pattern form of the EUV photomask PM, may pass through the projection optical system 1400, and may form an image corresponding to the pattern form of the EUV photomask PM on a substrate 110.

The projection optical system 1400 may include a plurality of reflective mirrors 1410 and 1430. In FIG. 3A, for ease of reference, it is illustrated that the two reflective mirrors 1410 and 1430 are provided in the projection optical system 1400. However, the projection optical system 1400 may include more reflective mirrors. For example, the projection optical system 1400 may commonly include four to eight reflective mirrors. The number of reflective mirrors included in the projection optical system 1400 is not limited thereto.

The substrate 110 may be arranged on the substrate stage 1500. The substrate stage 1500 may move in a first direction (an X direction) and a second direction (a Y direction) on an X-Y plane and may move in a third direction (a Z direction) perpendicular to the X-Y plane. Due to the movement of the substrate stage 1500, the substrate 110 may also move in the first direction (the X direction), the second direction (the Y direction), and/or the third direction (the Z direction) like the substrate stage 1500.

Referring to FIG. 2 again, the chamber modules 26 may include a fourth chamber module CM4 providing developer to a surface of exposed photoresist.

The developer may be provided to the surface of photoresist by, for example, the spin coating method.

The developer may be, for example, a nonpolar organic solvent. For example, the developer may selectively remove a soluble zone of photoresist. In some embodiments, the developer may include aromatic hydrocarbon, cyclohexane, cyclohexanone, acyclic or cyclic ethers, acetates, propionates, butyrates, lactates, or combinations thereof. For example, n-butyl acetate (nBA), propylene glycol methyl ether (PGME), propylene glycol methyl ether acetate (PGMEA), γ-butyrolactone (GBL), or isopropanol (IPA) may be used as the developer.

The chamber modules 26 may include a fifth chamber module CM5 receiving the substrate 110 (refer to FIG. 3A) from the fourth chamber module CM4 and removing the developer by supplying a surface tension reducing agent that is a gas to the substrate 110.

Figure 4:
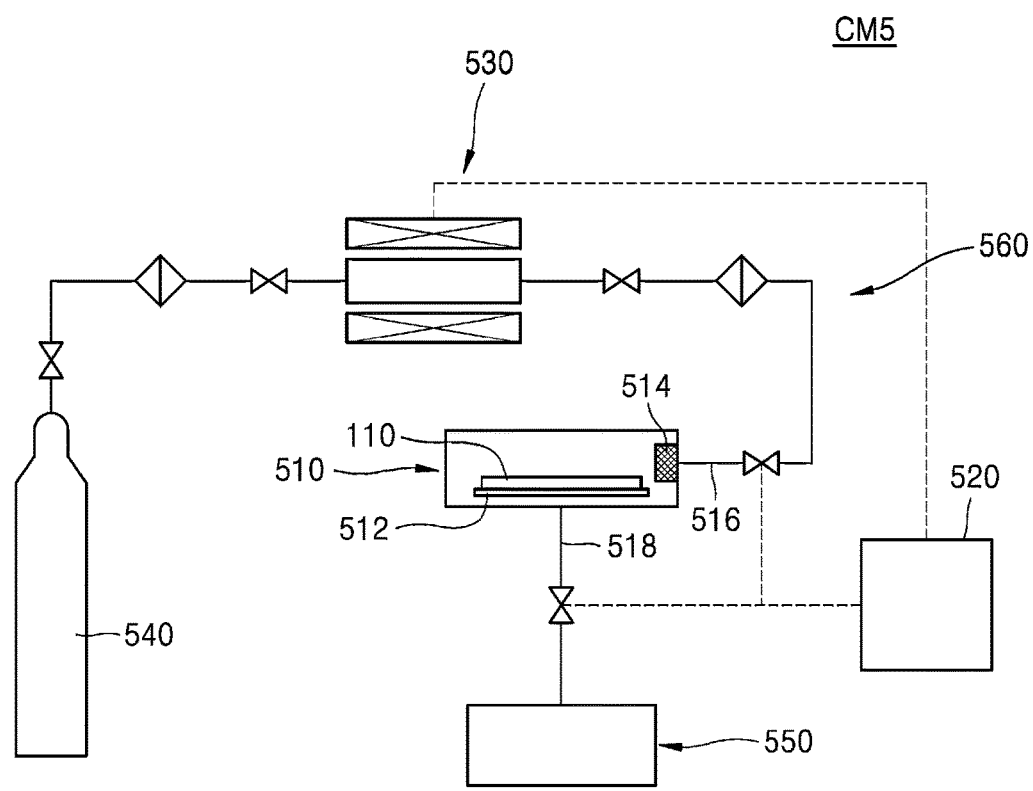
FIG. 4 is a schematic diagram illustrating main components of a fifth chamber module according to an embodiment of the inventive concept.

FIG. 4 is a schematic diagram illustrating main components of a fifth chamber module CM5 according to an embodiment of the inventive concept.

Referring to FIG. 4, the fifth chamber module CM5 may include a processing chamber 510 processing the substrate 110, a surface tension reducing agent supply system 560 configured to supply the surface tension reducing agent to the processing chamber 510, and a controller 520 controlling supply of the surface tension reducing agent.

The processing chamber 510 may have an internal space accommodating the substrate 110 to be processed and a support 512 supporting the substrate 110 in the internal space of the processing chamber 510.

In some embodiments, the support 512 may be an electrostatic chuck (ESC) fixing the substrate 110. In some embodiments, the support 512 may be rotatable. In some embodiments, the support 512 may support the substrate 110 so that a main surface of the substrate 110 is parallel with a gravity direction. The support 512 may be a bar-shaped structure supporting three or four points of an edge of the substrate 110.

The surface tension reducing agent supply system 560 includes a supply port 516 configured to supply the surface tension reducing agent to the internal space of the processing chamber 510 and a discharge port 518 configured to remove the developer from the internal space of the processing chamber 510. In addition, the supply port 516 may include a reduction structure or device 514 configured to reduce flow velocity of the surface tension reducing agent.

In some embodiments, the reduction device 514 may include an expanding conduit, the cross-sectional area of which increases in the velocity direction of the surface tension reducing agent. In some embodiments, the reduction device 514 may be a dispersant configured to disperse the supply of the surface tension reducing agent. The dispersant may include, for example, a porous material with high porosity. In some embodiments, the reduction structure 514 may include a baffle plate with a plurality of holes or apertures.

The surface tension reducing agent supply system 560 may include a surface tension reducing agent source 540 that stores the surface tension reducing agent and that supplies the stored surface tension reducing agent when required. The surface tension reducing agent supplied by the surface tension reducing agent source 540 may include a material with high miscibility with the developer and low chemical activity, capable of reducing surface tension of the developer when mixed with the developer.

The surface tension reducing agent as a gas may be, for example, $CO_2$, aliphatic hydrocarbon with 1 to 4 carbon atoms, $H_2$, $SO_2$, or a mixture of the above compounds. The aliphatic hydrocarbon may be, for example, methane, ethane, ethene, ethyne, propane, propene, n-butane, iso-butane, n-butene, or iso-butene. In some embodiments, the aliphatic hydrocarbon may be a nonpolar aliphatic hydrocarbon. When the developer is nBA, the surface tension reducing agent may be $CO_2$.

In some embodiments, a temperature of the surface tension reducing agent in the processing chamber 510 may be lower than a critical temperature of the surface tension reducing agent. In some embodiments, pressure of the surface tension reducing agent in the processing chamber 510 may be lower than critical pressure of the surface tension reducing agent. In some embodiments, the temperature of the surface tension reducing agent may be lower than the critical temperature of the surface tension reducing agent and the pressure of the surface tension reducing agent may be lower than the critical pressure of the surface tension reducing agent.

The temperature of the surface tension reducing agent in the processing chamber 510 may be about −20° C. to about 100° C., about 0° C. to about 80° C., about 20° C. to about 70° C., about 30° C. to about 65° C., or in an arbitrary range among the above ranges.

The pressure of the surface tension reducing agent in the processing chamber 510 as absolute pressure may be about 1.05 bar to about 3 bar, about 1.05 bar to about 2.2 bar, about 1.05 bar to about 1.2 bar, or in an arbitrary range among the above ranges.

The surface tension reducing agent source 540 and the processing chamber 510 may be connected to each other with a plurality of conduits and valves therebetween. In some embodiments, the surface tension reducing agent supplied by the surface tension reducing agent source 540 may be supplied to the processing chamber 510 through a heater 530. A heating temperature of the heater 530 may be controlled by the controller 520.

Supply, pressure, and temperature of the surface tension reducing agent supplied by the supply port 516 may be controlled by the controller 520. In addition, a method of which the developer and the surface tension reducing agent are discharged by the discharge port 518 may be controlled by the controller 520. In some embodiments, the controller 520 may maximize bulk flow of the developer on a surface of the substrate 110 through the supply of the surface tension reducing agent through the supply port 516 and control of pressure of the internal space of the processing chamber 510 through the discharge port 518.

In some embodiments, the surface tension reducing agent may be supplied through the supply port 516 in the form of a first pulse. At this time, relaxation of the pressure of the internal space of the processing chamber 510 through the discharge port 518 may be performed in the form of a second pulse properly corresponding to the first pulse. The form of the second pulse may be properly selected so as to maximize the bulk flow of the developer. The form of the first pulse does not necessarily coincide with that of the second pulse. In some embodiments, the second pulse may follow the first pulse with a slight gap in time. In other embodiments, the second pulse may precede the first pulse with a slight gap in time.

In some embodiments, the surface tension reducing agent may change to correspond to a single step, multiple steps, or a combination of the above steps through the supply port 516. At this time, the relaxation of the pressure of the internal space of the processing chamber 510 through the discharge port 518 may be performed to correspond to the single step, the multiple steps, or the combination of the above steps. The relaxation of the pressure of the internal space of the processing chamber 510 through the discharge port 518 may be performed so as to maximize the bulk flow of the developer to correspond to the single step, the multiple steps, or the combination of the above steps.

The developer discharged from the internal space of the processing chamber 510 through the discharge port 518 may be transferred to a drain 550.

FIGS. 5A to 5F are schematic diagrams illustrating main portions of processing chambers 510 according to embodiments of the inventive concept.

Figure 5A:
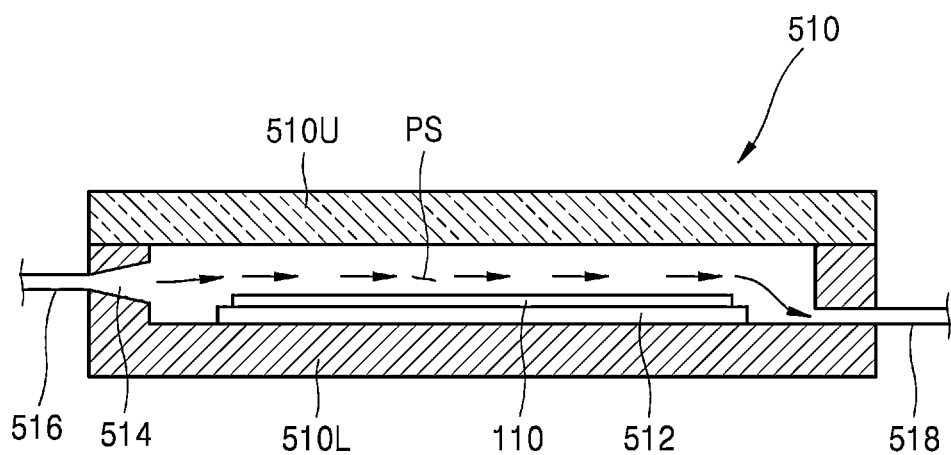
FIGS. 5A to 5F are schematic diagrams illustrating main portions of processing chambers according to embodiments of the inventive concept.

First, referring to FIG. 5A, the processing chamber 510 provides a processing space PS processing the substrate 110. For example, in the processing space PS, a process of drying the substrate 110 by using the surface tension reducing agent may be performed.

The processing chamber 510 may include an upper housing 510U, a lower housing 510L, the support 512, the supply port 516, and the discharge port 518.

The upper housing 510U and the lower housing 510L may be combined with each other to be opened and closed so that the processing chamber 510 may go back and forth between a position in which the processing space PS is closed and a position in which the processing space PS is opened to the air. In some embodiments, the lower housing 510L may form a space of which the top is opened and the upper housing 510U may be combined with the lower housing 510L so as to cover the space of the lower housing 510L. In this case, the upper housing 510U may generally comprise an upper wall of the processing chamber 510 and the lower housing 510L may generally comprise a bottom wall and side walls of the processing chamber 510. In other embodiments, the upper housing 510U may generally comprise the upper wall and the side walls of the processing chamber 510 and the lower housing 510L may generally comprise the bottom wall of the processing chamber 510. Alternatively, the upper housing 510U and the lower housing 510L may comprise the side walls of the processing chamber 510 together.

In some embodiments, the processing chamber 510 may go back and forth between the position in which the processing space PS is closed and the position in which the processing space PS is opened to the air by an elevating member ascending or descending the upper housing 510U and/or the lower housing 510L, a driving member driving movements of the upper housing 510U and the lower housing 510L, and a controller controlling the movements of the upper housing 510U and the lower housing 510L.

The supply port 516 may be provided at one side of the processing chamber 510. The supply port 516 may include the reduction device 514. In FIG. 5A, the reduction device 514 is illustrated as a diffuser. However, the inventive concept is not limited thereto.

At a side opposite to the side at which the supply port 516 is provided, the discharge port 518 may be provided. The discharge port 518 may become a path through which developer is removed by an excessive surface tension reducing agent and bulk flow is removed from the processing space PS.

The surface tension reducing agent received through the supply port 516 may flow along the surface of the substrate 110 in a horizontal direction. The surface tension reducing agent dissolves in the developer on the surface of the substrate 110 to reduce surface tension of the developer and, at the same time, cause the developer to flow in the horizontal direction due to shear stress between a surface of the developer and the surface tension reducing agent.

Because the surface tension of the developer deteriorates, although a free surface of the developer meets a surface of a photoresist pattern, the photoresist pattern does not collapse.

Figure 5B:
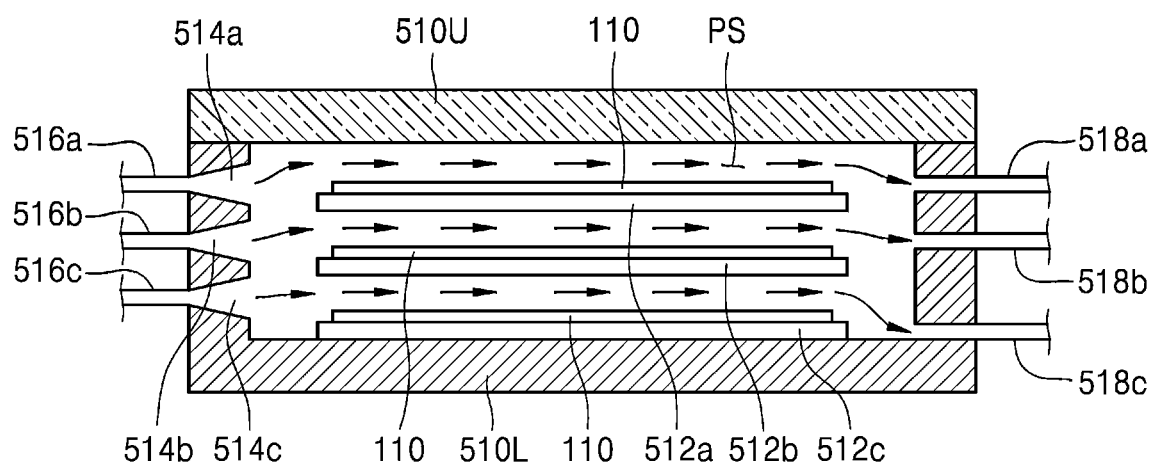

The processing chamber 510 illustrated in FIG. 5B is the same as the processing chamber 510 illustrated in FIG. 5A excluding that a plurality of substrates 110 are simultaneously processed. Therefore, hereinafter, such a difference will be mainly described.

Referring to FIG. 5B, in the processing space PS, a first support 512a, a second support 512b, and a third support 512c are arranged to overlap one another in a vertical direction (i.e., are spaced apart vertically) and the plurality of substrates 110 to be processed are respectively provided on the first support 512a, the second support 512b, and the third support 512c.

At one side of the processing chamber 510, a first supply port 516a, a second supply port 516b, and a third supply port 516c respectively corresponding to the first support 512a, the second support 512b, and the third support 512c are provided and, at an opposite side of the processing chamber 510, a first discharge port 518a, a second discharge port 518b, and a third discharge port 518c respectively corresponding to the first support 512a, the second support 512b, and the third support 512c are provided.

The first supply port 516a, the second supply port 516b, and the third supply port 516c may respectively include a first reduction device 514a, a second reduction device 514b, and a third reduction device 514c.

The surface tension reducing agent received through the first supply port 516a, the second supply port 516b, and the third supply port 516c may flow along surfaces of the plurality of substrates 110 in the horizontal direction. A principle in which the flow of the surface tension reducing agent removes the developer is the same as described with reference to FIG. 5A.

Then, the excessive surface tension reducing agent and the removed developer may be removed from the processing space PS through the first discharge port 518a, the second discharge port 518b, and the third discharge port 518c.

Because the processing chamber 510 illustrated in FIG. 5B may simultaneously process a plurality of substrates, high producibility may be achieved.

Figure 5C:
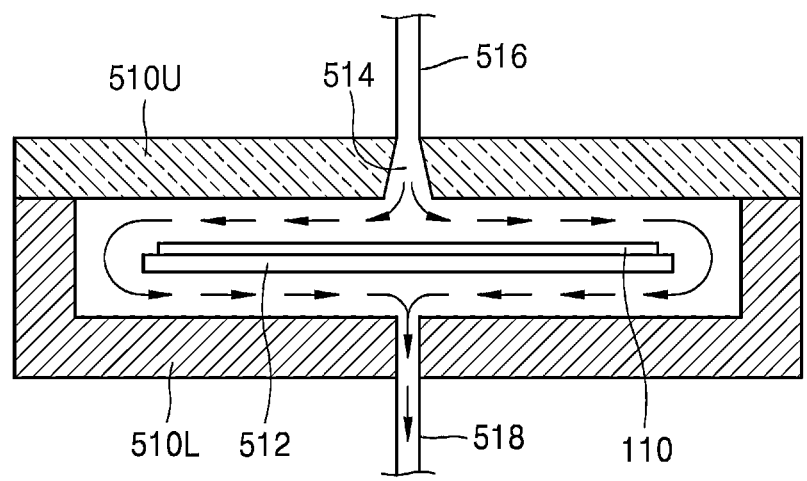

In the processing chamber 510 illustrated in FIG. 5C, the supply port 516 is provided in the center of the upper housing 510U and the surface tension reducing agent is supplied to the substrate 110 in the vertical direction. The supplied surface tension reducing agent flows along a surface of the substrate 110 in a radius direction of the substrate 110, as illustrated. A principle in which the flow of the surface tension reducing agent removes the developer is the same as described with reference to FIG. 5A.

Then, the excessive surface tension reducing agent and the removed developer may pass through a space under the support 512 and may be removed through the discharge port 518. The discharge port 518 may be provided in the center of the lower housing 510L.

Figure 5D:
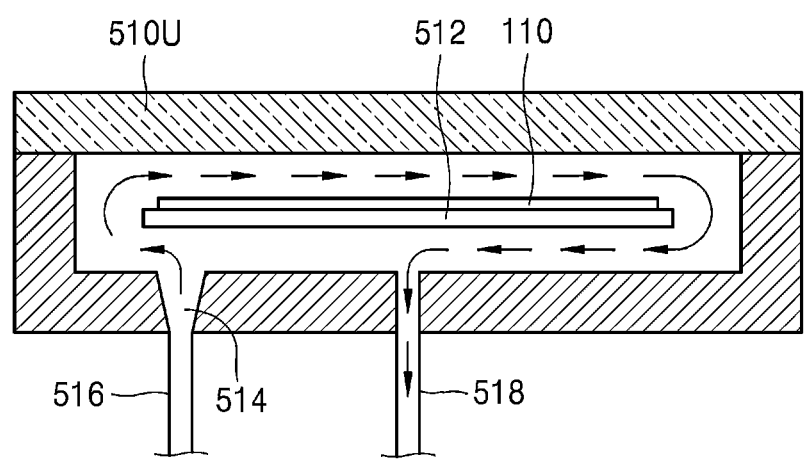

In the processing chamber 510 illustrated in FIG. 5D, the supply port 516 is spaced apart from the center of the lower housing 510L and the discharge port 518 is provided in the center of the lower housing 510L, as illustrated. The surface tension reducing agent supplied through the supply port 516 may flow to an upper surface of the substrate 110 through a gap of an edge of the support 512 and may flow along the surface of the substrate 110 in the horizontal direction as illustrated in FIG. 5A. A principle in which the flow of the surface tension reducing agent removes the developer is the same as described with reference to FIG. 5A.

Then, the excessive surface tension reducing agent and the removed developer may pass through a space under the support 512 and may be removed through the discharge port 518 in the center of the lower housing 510L.

Figure 5E:
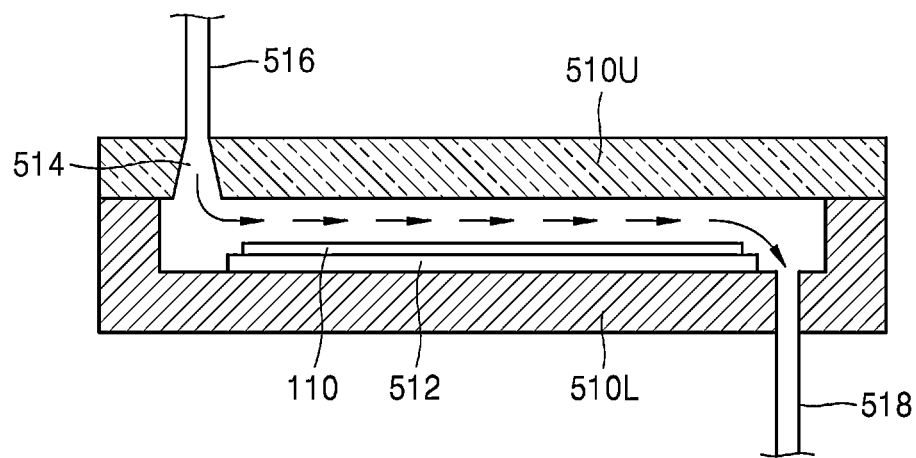

In the processing chamber 510 illustrated in FIG. 5E, the supply port 516 is spaced apart from the center of the upper housing 510U and the discharge port 518 is spaced apart from the center of the lower housing 510L, as illustrated. In some embodiments, the supply port 516 and the discharge port 518 may be provided on opposite sides to each other around the center of the upper housing 510U (that is, the center of the lower housing 510L).

The surface tension reducing agent supplied through the supply port 516 may flow to an upper surface of the substrate 110 and may flow along the surface of the substrate 110 in the horizontal direction as illustrated in FIG. 5A. A principle in which the flow of the surface tension reducing agent removes the developer is the same as described with reference to FIG. 5A.

Then, the excessive surface tension reducing agent and the removed developer may be removed through the discharge port 518 spaced apart from the center of the lower housing 510L.

Figure 5F:
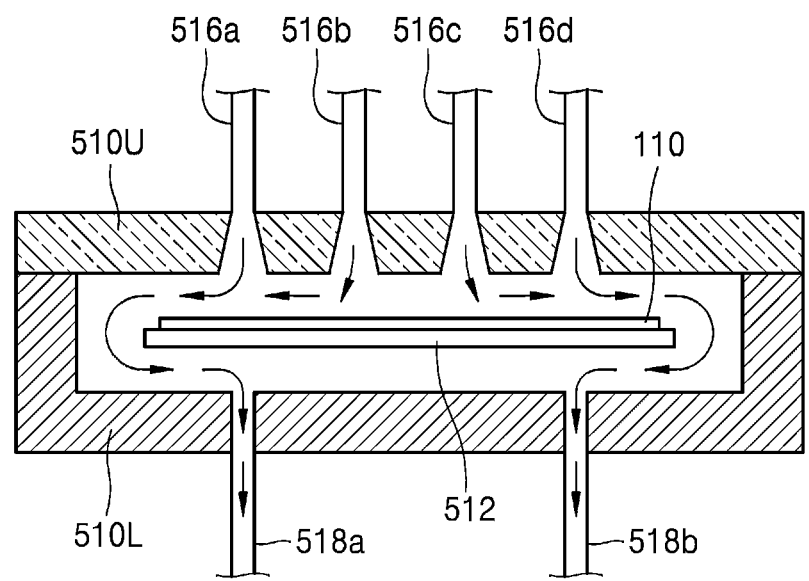

In the processing chamber 510 illustrated in FIG. 5F, a first supply port 516a, a second supply port 516b, a third supply port 516c, and a fourth supply port 516d are provided to the upper housing 510U, as illustrated. In addition, a first discharge port 518a and a second discharge port 518b are provided to the lower housing 510L, as illustrated.

The surface tension reducing agent received through the first supply port 516a, the second supply port 516b, the third supply port 516c, and the fourth supply port 516d may flow along a surface of the substrate 110 in the horizontal direction. A principle in which the flow of the surface tension reducing agent removes the developer is the same as described with reference to FIG. 5A.

Then, the excessive surface tension reducing agent and the removed developer may be removed from the processing space PS through the first discharge port 518a and the second discharge port 518b.

Figure 6A:
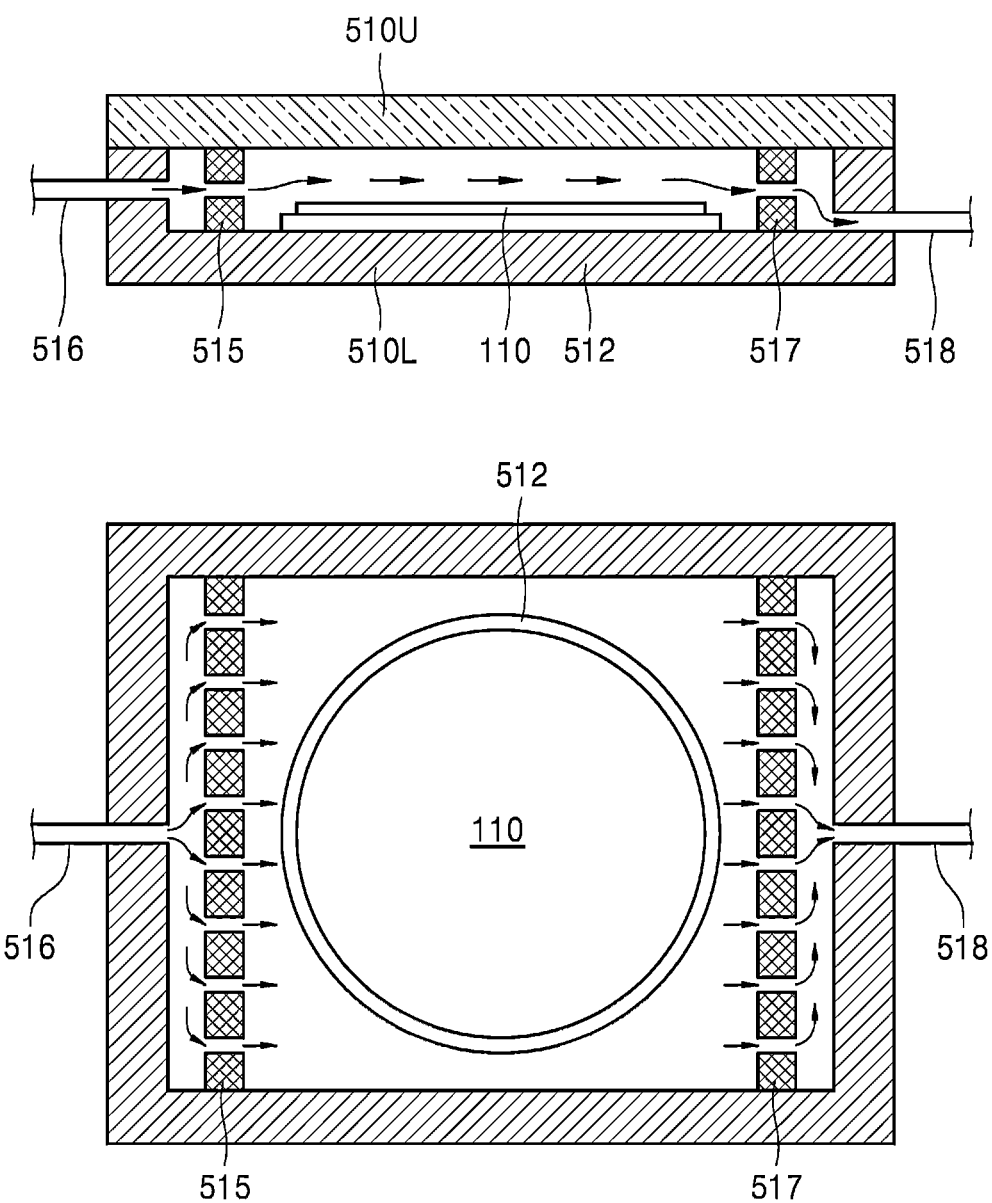
FIGS. 6A and 6B are schematic diagrams illustrating main portions of processing chambers according to other embodiments of the inventive concept.
Figure 6B:
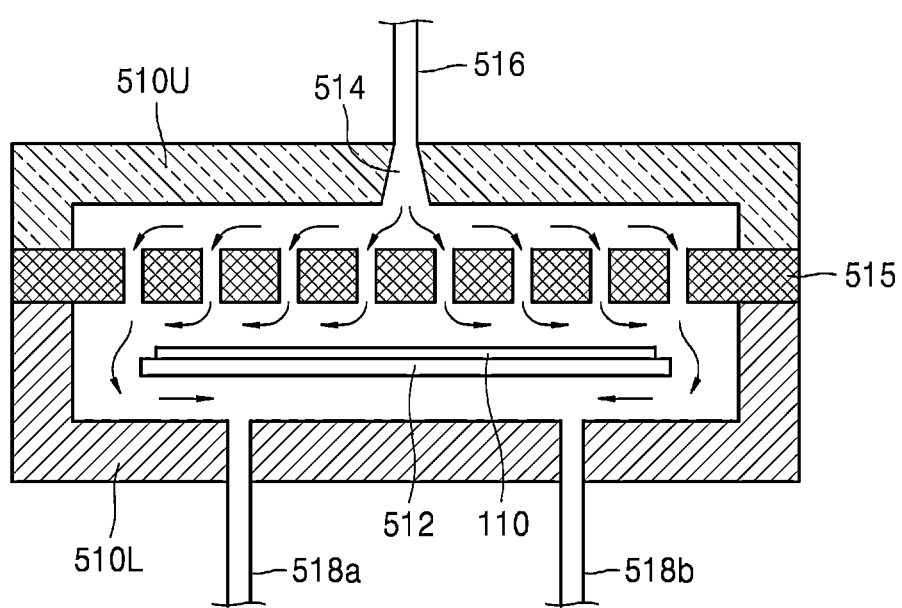

FIGS. 6A and 6B are schematic diagrams illustrating main portions of processing chambers according to other embodiments of the inventive concept.

The processing chamber 510 of FIG. 6A is the same as the processing chamber 510 of FIG. 5A excluding that the processing chamber 510 of FIG. 6A further includes distributors 515, 517. Therefore, hereinafter, such a difference will be mainly described and previously given description will not be given.

FIG. 6A illustrates a side view and a plan view of the processing chamber 510. Supply side distributors 515 are provided between the supply port 516 and the support 512. Pressure and flow velocity of the surface tension reducing agent supplied through the supply port 516 are reduced in a space between the supply port 516 and the supply side distributors 515 and the surface tension reducing agent is dispersed over the entire processing space. The surface tension reducing agent passing through the supply side distributors 515 may flow along a surface of the substrate 110 in the horizontal direction. A principle in which the flow of the surface tension reducing agent removes the developer is the same as described with reference to FIG. 5A.

Then, the excessive surface tension reducing agent and the removed developer may be pushed to a space between a discharge side distributor 517 and the discharge port 518 and may be discharged through the discharge port 518. Because the discharge side distributor 517 may have vortex that may be formed in the corner of the processing chamber 510 limitedly formed in the space between the discharge side distributor 517 and the discharge port 518, the discharge side distributor 517 may contribute to securing uniform flow in the processing space.

The processing chamber 510 of FIG. 6B is the same as the processing chamber 510 of FIG. 5C excluding that the processing chamber 510 of FIG. 6B further includes distributors. Therefore, hereinafter, such a difference will be mainly described and previously given description will not be given.

Referring to FIG. 6B, the supply side distributors 515 are provided between the supply port 516 and the substrate 110. Pressure and flow velocity of the surface tension reducing agent supplied through the supply port 516 are reduced in a space between the supply port 516 and the supply side distributors 515 and the surface tension reducing agent is dispersed over the entire processing space. The surface tension reducing agent passing through the supply side distributors 515 may flow along a surface of the substrate 110 in the horizontal direction. A principle in which the flow of the surface tension reducing agent removes the developer is the same as described with reference to FIG. 5A.

Then, the excessive surface tension reducing agent and the removed developer may be removed from the processing space PS through the first discharge port 518a and the second discharge port 518b.

Figure 7A:
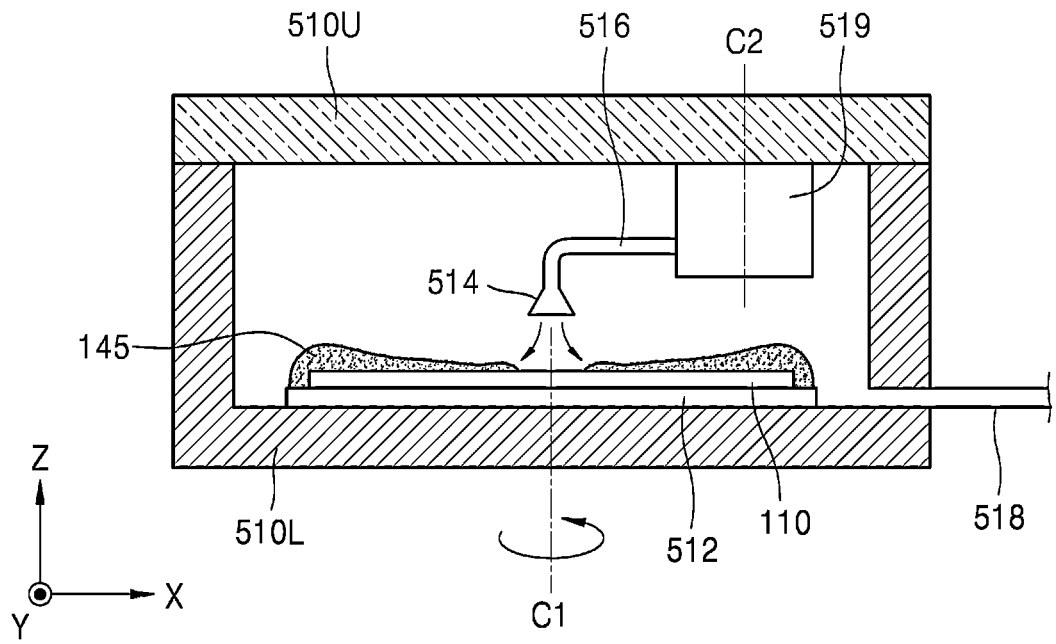
FIGS. 7A and 7B are schematic diagrams illustrating an operation of a processing chamber according to another embodiment of the inventive concept.
Figure 7B:
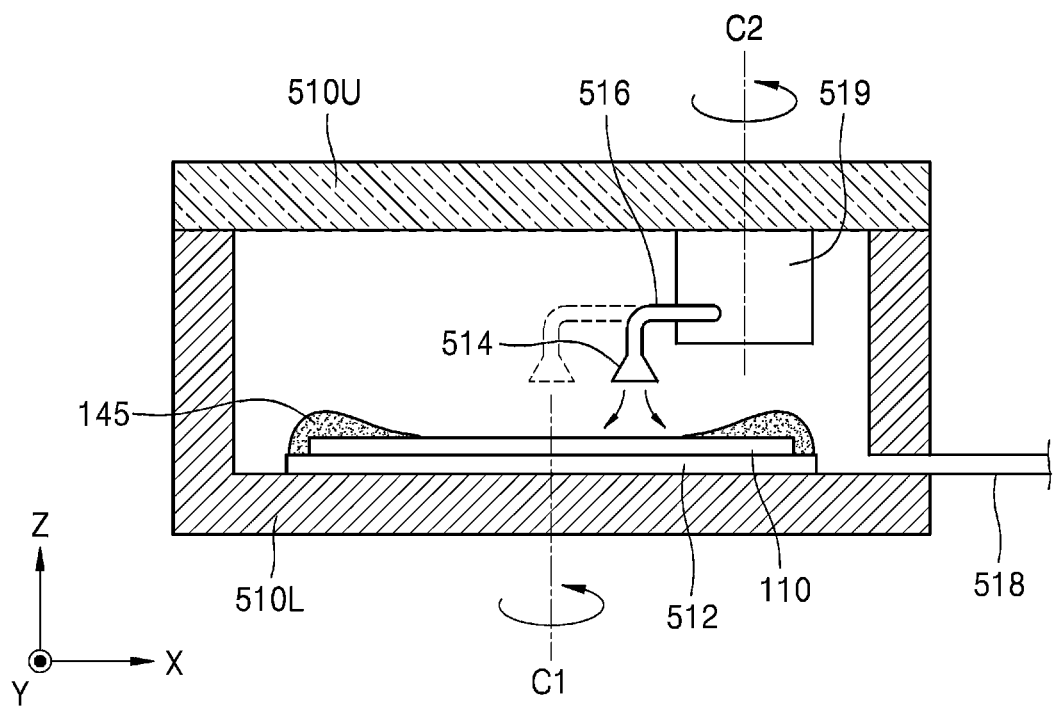

FIGS. 7A and 7B are schematic diagrams illustrating an operation of a processing chamber 510 according to another embodiment of the inventive concept.

The processing chamber 510 illustrated in FIG. 7A is the same as the processing chamber 510 illustrated in FIG. 5A excluding that the supply port 516 may actively move in an internal space of the processing chamber 510. Therefore, hereinafter, such a difference will be mainly described and previously given description will not be given.

Referring to FIG. 7A, the supply port 516 may be connected to an actuator 519 and may move in a specific direction. In some embodiments, the supply port 516 may be in linear motion in a radius direction (that is, the X direction, the Y direction, or a combination of the X and Y directions) of the substrate 110 and/or may be in linear motion in a direction (that is, the Z direction) perpendicular to the substrate 110. The linear motion may be reciprocating motion.

In some embodiments, the supply port 516 may move along a predetermined arc. At this time, the arc may pass through the center of the substrate 110 and a radius of the arc may be greater than or equal to the radius of the substrate 110.

The support 512 may rotate around an axis C1. When the reduction device 514 of the supply port 516 is provided on the axis C1 that is the center of the rotational motion, developer 145 may bulk flow toward an edge of the substrate 110 in the radius direction of the substrate 110 by applying centrifugal force generated by the rotational motion and force generated by the flow of the surface tension reducing agent in the horizontal direction together. As a result, almost all of the developer 145 in the center of the substrate 110 may be removed and the remaining developer 145 may be pushed toward the edge of the substrate 110.

Referring to FIG. 7B, the reduction device 514 of the supply port 516 is spaced apart from the axis C1 that is the center of the rotational motion of the support 512 by the actuator 519. Because the substrate 110 continuously rotates around the axis C1, the developer 145 continuously receives centrifugal force and receives force toward the edge of the substrate 110 in the radius direction thereof. Furthermore, the developer 145 receives more force toward the edge of the substrate 110 in the radius direction of the substrate 110 by the surface tension reducing agent supplied from the reduction device 514 spaced apart from the axis C1. As a result, the developer 145 is pushed toward the edge of the substrate 110.

That is, as the reduction device 514 is gradually remote from the axis C1, the developer 145 may be pushed toward the edge of the substrate 110 and may be completely removed from the center of the substrate 110. As a result, when the reduction device 514 is close to the edge of the substrate 110, all the developer 145 may be removed from the substrate 110.

In FIG. 7B, it is illustrated that the actuator 519 is gradually in rotational motion around an axis C2 so that the reduction device 514 of the supply port 516 moves toward the edge of the substrate 110. However, the same object may be achieved by the supply port 516 being in linear motion in the horizontal direction.

Figure 8A:
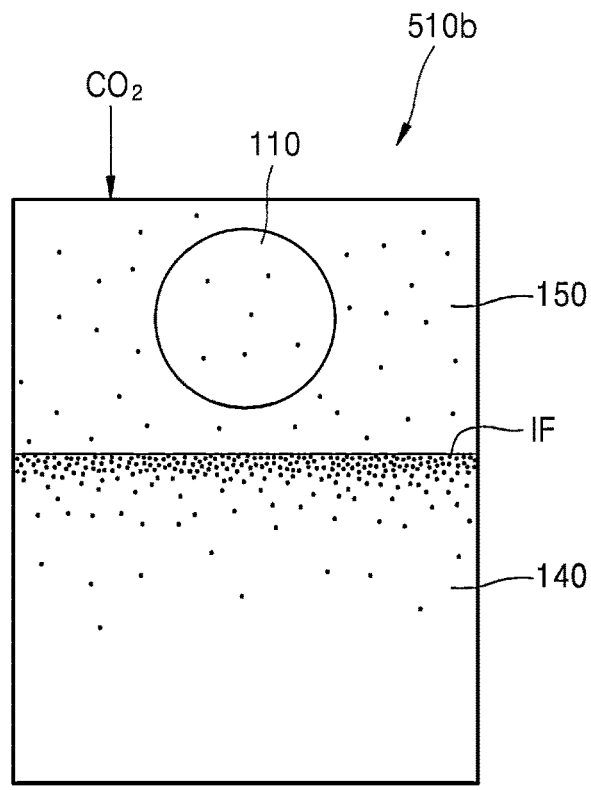
FIGS. 8A and 8B are schematic diagrams illustrating a substrate processing method according to an embodiment of the inventive concept.
Figure 8B:
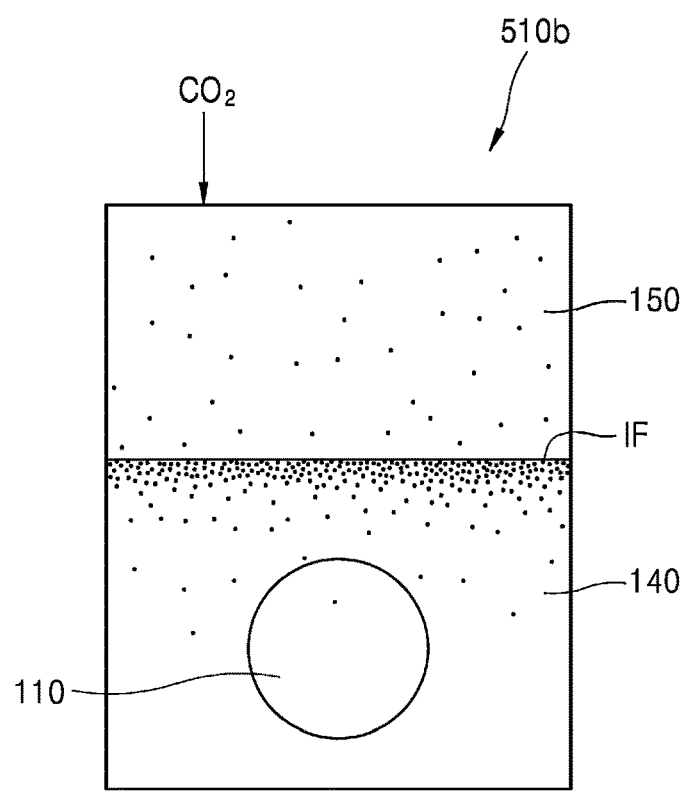

FIGS. 8A and 8B are schematic diagrams illustrating a substrate processing method according to an embodiment of the inventive concept.

Referring to FIG. 8A, developer 140 is filled in a processing chamber 510b at a predetermined level and a surface tension reducing agent 150 (here, $CO_2$) is provided in a remaining space. Because the surface tension reducing agent 150 has high miscibility with the developer 140 and is slowly diffused in the developer 140 as a liquid, the surface tension reducing agent 150 has high concentration around an interface IF.

A main surface of the substrate 110 having an exposed photoresist layer may be arranged to be perpendicular to a free surface of the developer 140. As used herein, the term "free surface" refers to a surface of a fluid formed when no external stress is applied thereto. Here, the free surface is substantially identical to the interface IF. Here, the substrate 110 is illustrated as being singular. However, a plurality of substrates may overlap to be apart from one another.

Referring to FIG. 8B, the substrate 110 is gradually dipped in the developer 140 in the vertical direction. The developer 140 may freely contact the photoresist layer on the substrate 110 dipped therein. The photoresist layer may have a portion exposed to EUV and a portion that is not exposed to EUV. In accordance with characteristics of photoresist and developer, the portion exposed to EUV may be removed or the portion that is not exposed to EUV may be removed.

Then, the substrate 110 may be raised in the vertical direction with a direction thereof maintained so that the developer 140 may be removed from the substrate 110.

When the substrate 110 passes through the interface IF, surface tension is applied. If the surface tension reducing agent 150 is not provided, when the substrate 110 passes through the interface IF, due to the high surface tension of the interface IF, the photoresist pattern may collapse. However, because the surface tension reducing agent 150 with high concentration is provided around the interface IF and the surface tension of the interface IF is reduced, it is possible to prevent the photoresist pattern from collapsing.

In addition, because the surface tension of the interface IF is low, due to gravity, the developer 140 may not remain on the surface of the substrate 110 and may be almost completely removed from the substrate 110.

While the substrate 110 is dipped in the developer 140 and is taken out, the surface tension reducing agent 150 may be continuously supplied from the outside of the processing chamber 510b onto the interface IF. Therefore, the concentration of the surface tension reducing agent 150 in the interface IF may be continuously maintained to be high and the surface tension of the interface IF may be continuously maintained to be low.

FIGS. 9A to 9E are schematic graphs illustrating a change in pressure in a processing chamber according to embodiments of the inventive concept.

Figure 9A:
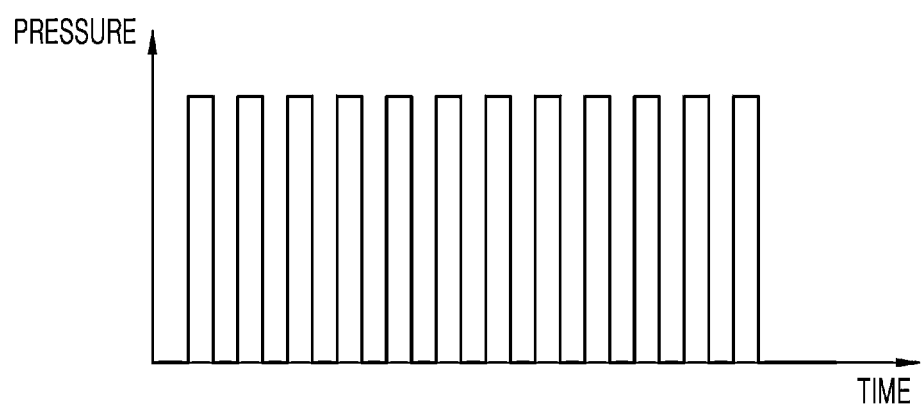
FIGS. 9A to 9E are schematic graphs illustrating a change in pressure in a processing chamber according to embodiments of the inventive concept.

Referring to FIG. 9A, by pulse supplying the surface tension reducing agent, the change in pressure of the processing chamber may be in the form of a pulse.

Duration of one of the above pulses may be about 1 second to about 6 seconds. In some embodiments, the duration of the pulse may be about 3 seconds to about 5 seconds. The change in pressure of the processing chamber, which is caused by the pulse, may be about 0.05 bar to about 2 bar. In some embodiments, the change in pressure of the processing chamber may be about 0.05 bar to about 1.2 bar.

Figure 9B:
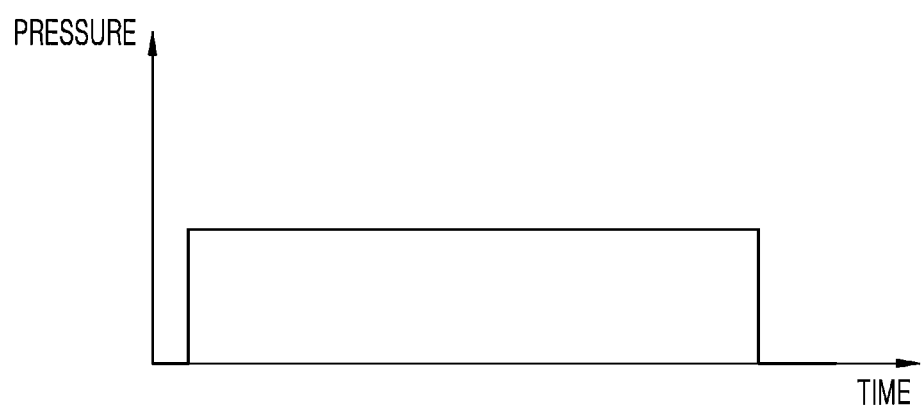

Referring to FIG. 9B, by supplying the surface tension reducing agent in the form of the single step, the change in pressure of the processing chamber may be in the form of the single step.

The step may be continuously performed until one substrate 110 is completely processed. In addition, the change in pressure of the processing chamber may be about 0.05 bar to about 2 bar due to the step. In some embodiments, the change in pressure of the processing chamber may be about 0.05 bar to about 1.2 bar.

Figure 9C:
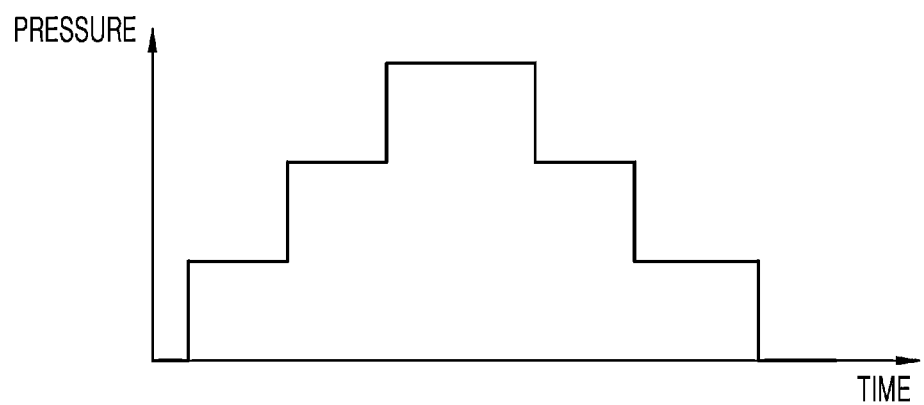

Referring to FIG. 9C, by supplying the surface tension reducing agent in the form of the multiple steps, the change in pressure of the processing chamber may be in the form of the multiple steps.

The multiple steps may be continuously performed until one substrate 110 is completely processed. In addition, due to the multiple steps, the maximum change in pressure of the processing chamber may be about 0.05 bar to about 2 bar. In some embodiments, the maximum change in pressure of the processing chamber may be about 0.05 bar to about 1.2 bar.

Figure 9D:
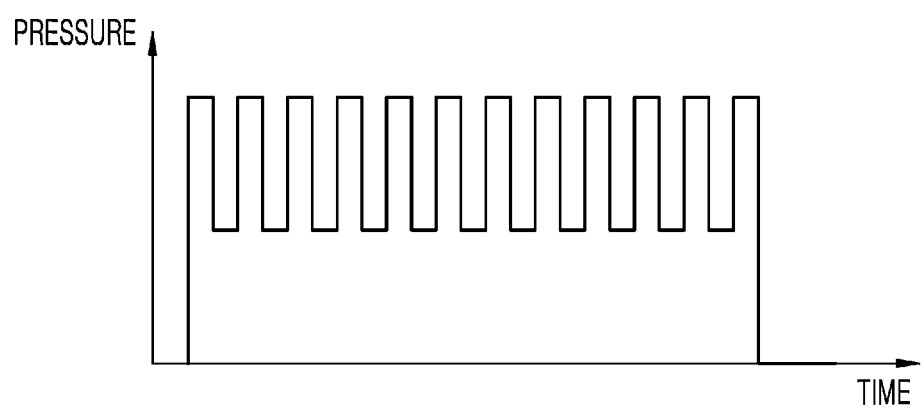

Referring to FIG. 9D, the surface tension reducing agent may be supplied in the form of a combination of a plurality of pulses and the single step. That is, when the pressure profile in the form of the pulse of FIG. 9A is combined with the pressure profile in the form of the single step of FIG. 9B, the pressure profile of FIG. 9D may be obtained.

The combined pressure profile may continue until one substrate 110 is completely processed. In addition, the maximum change in pressure of the processing chamber in accordance with the pressure profile may be about 0.05 bar to about 2 bar. In some embodiments, the maximum change in pressure of the processing chamber may be about 0.05 bar to about 1.2 bar.

Figure 9E:
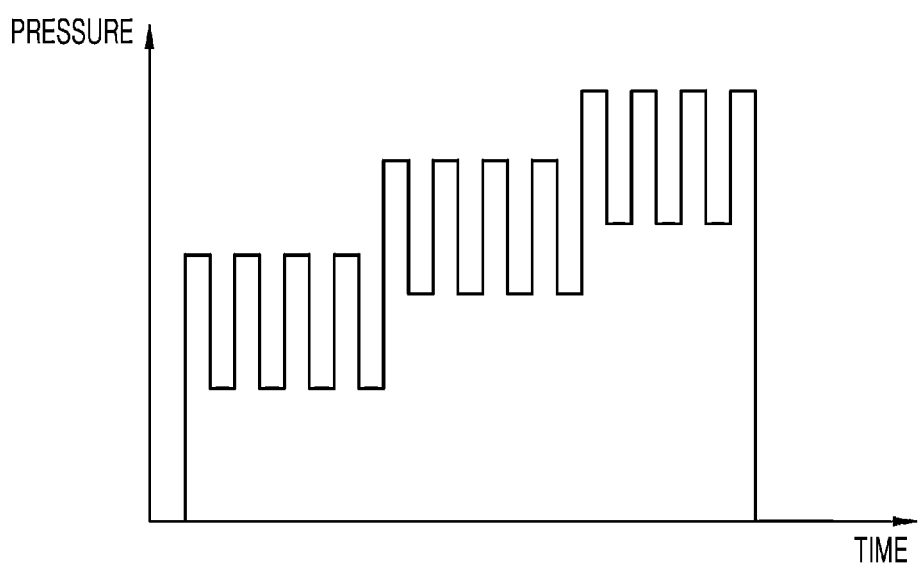

Referring to FIG. 9E, the surface tension reducing agent may be supplied in the form of a combination of a plurality of pulses and the multiple steps. That is, when the pressure profile in the form of the pulse of FIG. 9A is combined with the pressure profile in the form of the multiple steps of FIG. 9C, the pressure profile of FIG. 9E may be obtained.

The combined pressure profile may continue until one substrate 110 is completely processed. In addition, the maximum change in pressure of the processing chamber in accordance with the pressure profile may be about 0.05 bar to about 2 bar. In some embodiments, the maximum change in pressure of the processing chamber may be about 0.05 bar to about 1.2 bar.

Figure 10A:
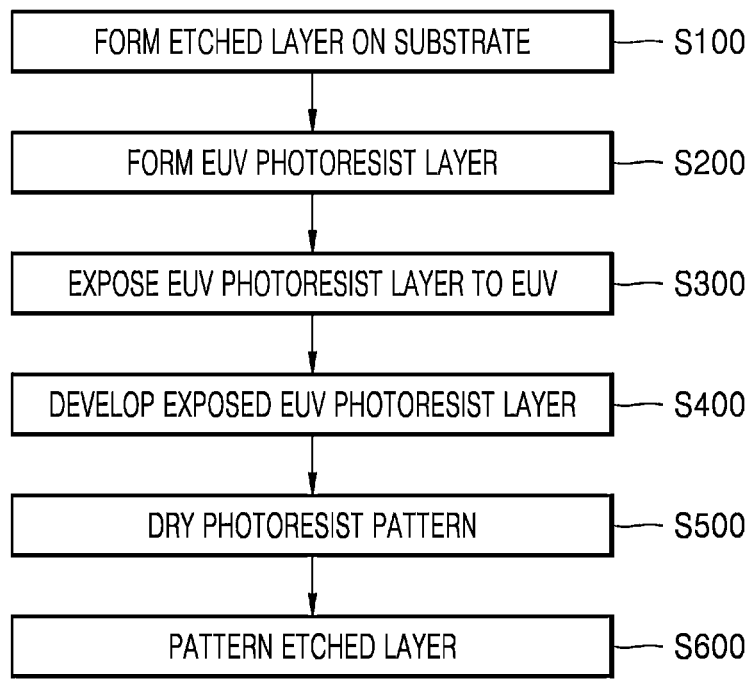
FIG. 10A is a flowchart illustrating an embodiment of a method of forming a micropattern on a substrate.
Figure 10B:
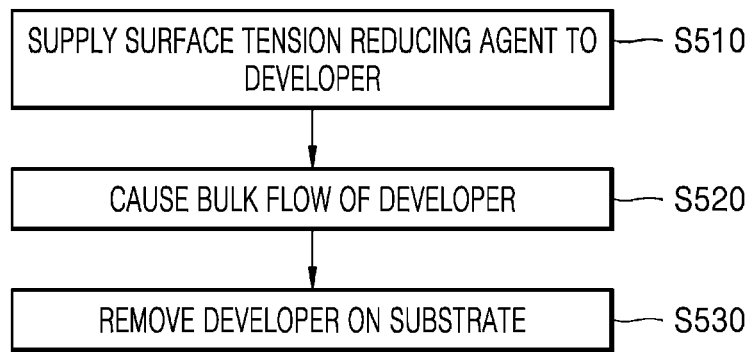
FIG. 10B is a flowchart illustrating an embodiment of a method of removing and drying developer by a substrate processing apparatus.

FIG. 10A is a flowchart illustrating an embodiment of a method of forming a micropattern on a substrate and FIG. 10B is a flowchart illustrating an embodiment of a method of removing and drying developer by a substrate processing apparatus. FIGS. 11A to 11J are side sectional views illustrating an embodiment of a method of forming a micropattern on a substrate.

Figure 11A:
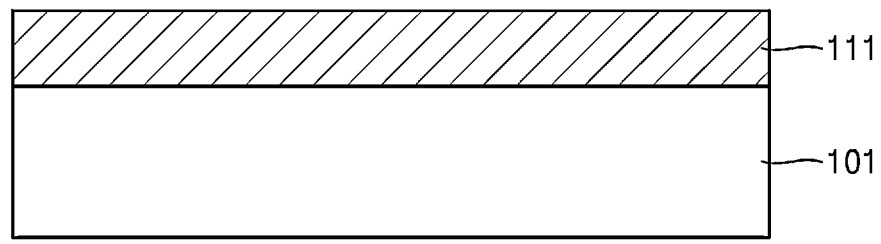
FIGS. 11A to 11J are side sectional views illustrating an embodiment of a method of forming a micropattern on a substrate.

Referring to FIGS. 10A and 11A, an etched layer 111 may be formed on a base substrate 101 in operation S100.

The base substrate 101 may include Si, for example, crystalline Si, polycrystalline Si, or amorphous Si. In other embodiments, the base substrate 101 may include semiconductor such as Ge or compound semiconductor such as SiGe, SiC, GaAs, InAs, or InP. In some embodiments, the base substrate 101 may have a silicon on insulator (SOI) structure. For example, the base substrate 101 may include a buried oxide (BOX) layer. In some embodiments, the base substrate 101 may include a conductive region, for example, a well doped with impurities or a structure doped with impurities.

In addition, semiconductor devices such as transistors or diodes may be formed on the base substrate 101. In addition, a plurality of wiring lines may be arranged on the base substrate 101 in multiple layers and may be electrically isolated from one another by an interlayer insulating layer.

The etched layer 111 may include a conductive layer, a dielectric layer, an insulating layer, or a combination of the above layers. For example, the etched layer 111 may include a metal, an alloy, metal carbide, metal nitride, metal oxynitride, metal oxycarbide, semiconductor, polysilicon, oxide, nitride, oxynitride, or a combination of the above materials. However, the inventive concept is not limited thereto.

Figure 11B:
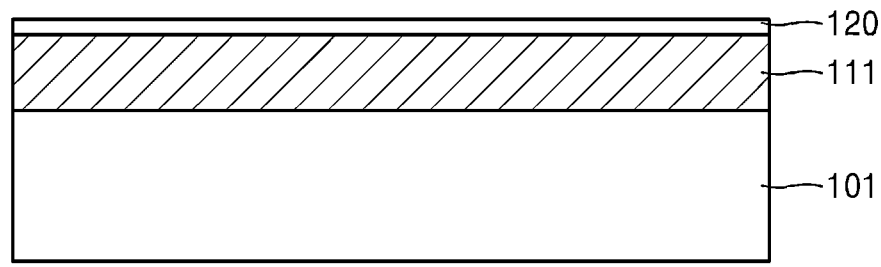

Referring to FIGS. 10A and 11B, an antireflection layer 120 may be formed on the etched layer 111.

The antireflection layer 120 may prevent total reflection of light in a subsequent exposure process. The antireflection layer 120 may include an organic component in an absorbance structure and a solvent for dispersing the organic component. The absorbance structure may be, for example, a hydrocarbon compound in a structure in which one or more benzene rings are fused.

The antireflection layer 120 may be formed by, for example, the spin coating method. However, the inventive concept is not limited thereto.

Figure 11C:
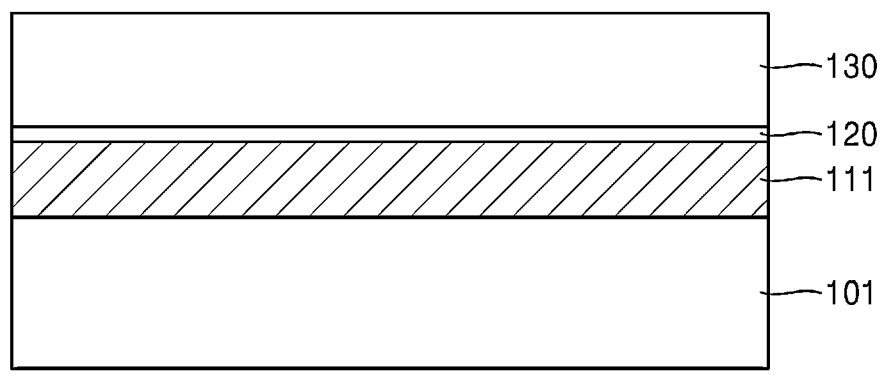

Referring to FIGS. 10A and 11C, an EUV photoresist layer 130 may be formed on the antireflection layer 120 in operation S200.

The EUV photoresist layer 130 may be formed by the spin coating method, the spray coating method, or the deep coating method. The EUV photoresist layer 130 may be formed to a thickness of, for example, about 30 nm to about 150 nm. After forming the EUV photoresist layer 130, a soft baking process may be performed at a temperature of about 80° C. to about 130° C. for about 40 seconds to about 100 seconds.

Because the material of the EUV photoresist layer 130 is described in detail with reference to FIG. 2, description thereof will not be given.

Figure 11D:
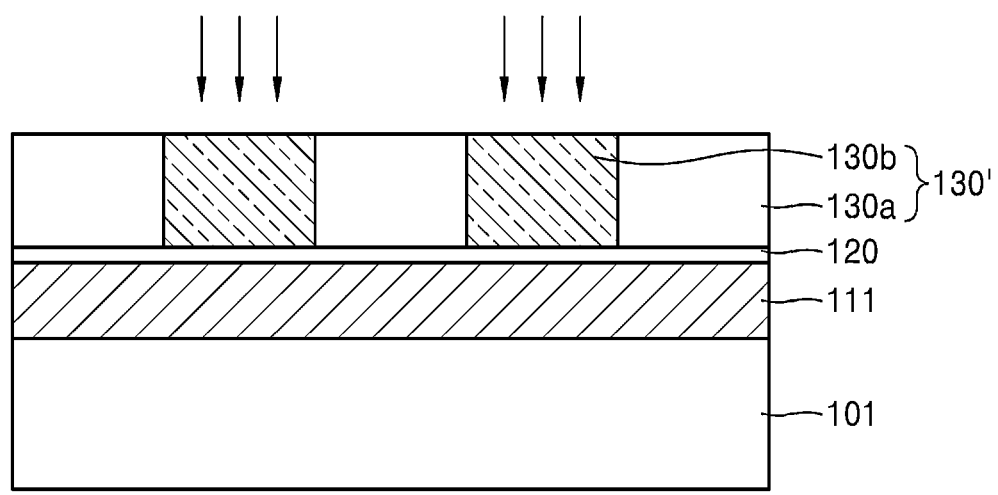

Referring to FIGS. 10A and 11D, the EUV photoresist layer 130 may be exposed by using the EUV optical system illustrated in FIG. 3 in operation S300.

In accordance with a kind of photoresist used, an exposed portion may be removed by developing or an unexposed portion may be removed by developing. Here, the unexposed portion is illustrated as being removed by negative tone developer (NTD) later. A person skilled in the art may understand that the exposed portion may be removed by NTD.

An exposed EUV photoresist layer 130' may be divided into an exposed portion 130b and an unexposed portion 130a. In the exposed portion 130b, EUV generates acid from a photoacid generator included in the EUV photoresist layer 130' so that photosensitive polymer is deprotected. On the other hand, because EUV is not irradiated onto the unexposed portion 130a, such a chemical reaction does not occur in the unexposed portion 130a.

Due to deprotection of photosensitive polymer, for example, an ester group (—COOR) before being exposed may be converted to a carboxyl group (—COOH). R combined with the ester group may be a protecting group described above.

Figure 11E:
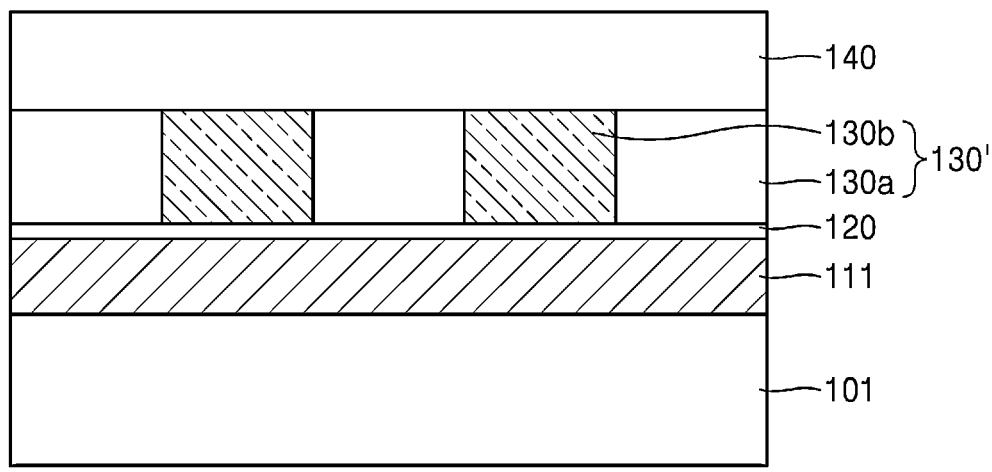

Referring to FIGS. 10A and 11E, the EUV photoresist layer 130' may be developed in operation S400.

The EUV photoresist layer 130' may be developed by using developer such as the nonpolar organic solvent. Because developer and a method of coating the same are described in detail with reference to FIG. 2, description thereof will not be given.

In order to develop the EUV photoresist layer 130', a developer layer 140 may be formed on the EUV photoresist layer 130'. Because developer of the developer layer 140 is not exposed to EUV and has high miscibility with polymer maintaining a protecting group, an unexposed portion dissolves in the developer layer 140. In addition, because a portion exposed to EUV is deprotected, miscibility with developer deteriorates.

Figure 11F:
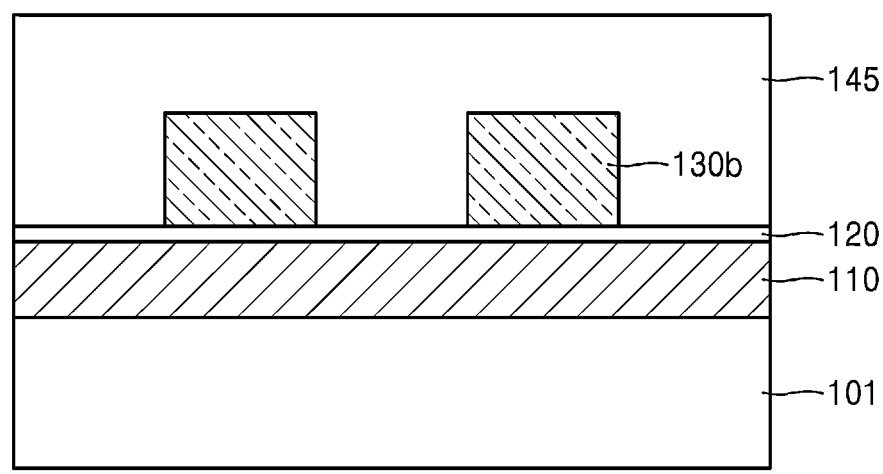

Referring to FIGS. 10A and 11F, a developer layer 145 mixed with the dissolved unexposed portion 130a is obtained. Developer of the developer layer 145 may have a first concentration.

Because the exposed portion 130b does not dissolve in developer of the developer layer 145, the exposed portion 130b remains as it is.

Hereinafter, referring to FIG. 10B, a process of removing the developer layer 145 and drying a photoresist pattern is described in operation S500.

Figure 11G:
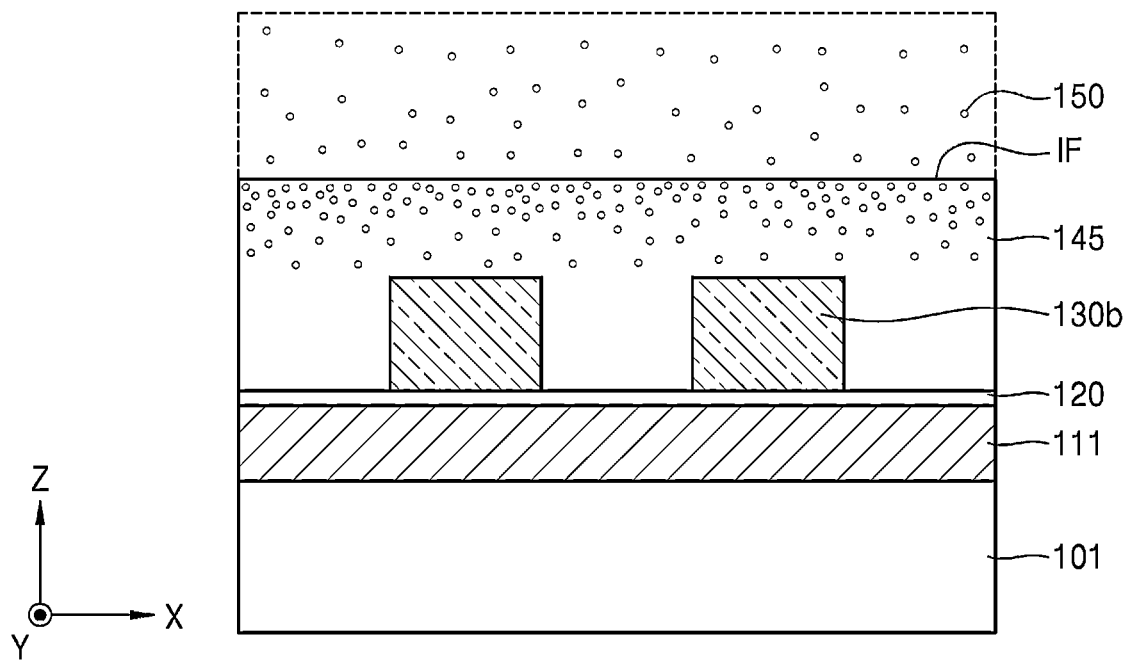

Referring to FIGS. 10A, 10B, and 11G, the surface tension reducing agent 150 as a gas is supplied onto a substrate in operation S510.

In some embodiments, the surface tension reducing agent 150 may be supplied to the developer layer 145.

The surface tension reducing agent 150 may be transferred to the developer layer 145. That is, the surface tension reducing agent 150 may be changed from a gas phase to a liquid phase. When the surface tension reducing agent 150 has high miscibility with the developer 140 and dissolves well in the developer 140, a speed at which the surface tension reducing agent 150 is changed from the gas phase to the liquid phase increases. When the speed at which the surface tension reducing agent 150 is changed from the gas phase to the liquid phase sufficiently increases, the speed at which the surface tension reducing agent 150 is changed from the gas phase to the liquid phase may be much greater than a molecular diffusion rate of the surface tension reducing agent 150 in the liquid phase and the surface tension reducing agent 150 is caught around the interface IF between the surface tension reducing agent 150 in the gas phase and the developer layer 145 so that the concentration of the surface tension reducing agent 150 may increase.

FIG. 11G conceptually illustrates that the concentration of the surface tension reducing agent 150 in the liquid phase around the interface IF is greater than the concentration of the surface tension reducing agent 150 in a bulk liquid phase.

In addition, when the surface tension reducing agent 150 is mixed with the developer layer 145, surface tension of the developer layer 145, that is, surface tension of the developer layer 145 in the interface IF is reduced.

Figure 11H:
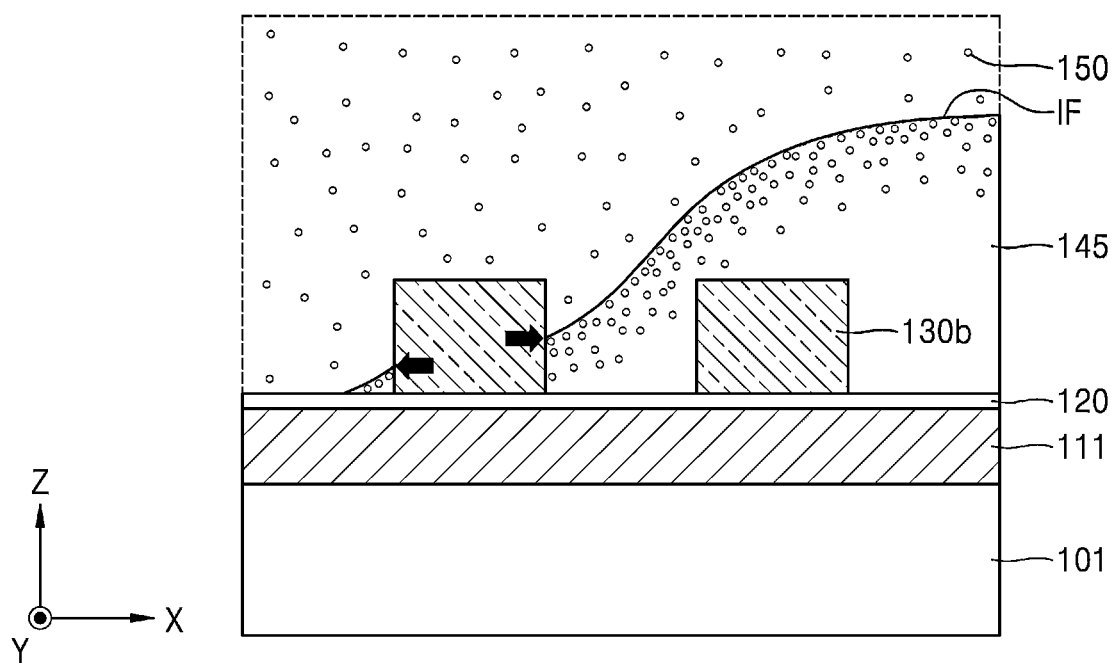

Referring to FIGS. 10A, 10B, and 11H, bulk flow of the developer layer 145 is caused in operation S520.

In FIG. 11H, a direction in which the surface tension reducing agent 150 is supplied is not illustrated. However, in a partial region of the developer layer 145, flow of the surface tension reducing agent 150 in the vertical direction facing down (that is, a −Z direction) may prevail and, in another partial region of the developer layer 145, flow of the surface tension reducing agent 150 in the horizontal direction facing the right side (that is, a +X direction) may prevail. The flow of the surface tension reducing agent 150 in the −Z direction and the +X direction may cause the bulk flow of the developer layer 145.

As a result, as illustrated in FIG. 11H, the developer layer 145 may flow in the +X direction. As the developer layer 145 flows in the +X direction, the interface IF is exposed to EUV and meets remaining surfaces of the exposed portion 130b (refer to portions marked with arrows). If the surface tension reducing agent 150 is not included in the developer layer 145, a pattern of the exposed portion 130b may collapse due to the surface tension of the developer layer 145.

On the other hand, in the current embodiment, because the surface tension reducing agent 150 is included in the developer layer 145 and is provided around the interface IF with high concentration, the surface tension of the developer layer 145 is remarkably reduced. As a result, although the interface IF meets the remaining surfaces of the exposed portion 130b, the pattern of the exposed portion 130b does not collapse.

In FIG. 10B, it is illustrated that operation S510 of supplying the surface tension reducing agent 150 to the developer and operation S520 of causing the bulk flow of the developer are sequentially performed. However, operation S510 and operation S520 may be simultaneously performed.

Figure 11I:
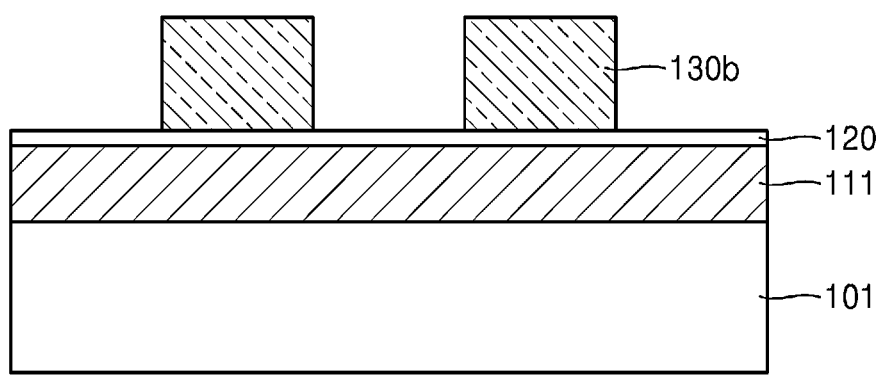

Referring to FIGS. 10B and 11I, the bulk flow may be continuously performed so that the developer layer 145 may be removed in operation S530. When the developer layer 145 is removed, the exposed portion 130b is exposed.

In some embodiments, the exposed portion 130b may be baked. The exposed portion 130b may be baked at a temperature of about 120° C. to about 170° C. for about 30 seconds to about 2 minutes. However, the inventive concept is not limited thereto.

Figure 11J:
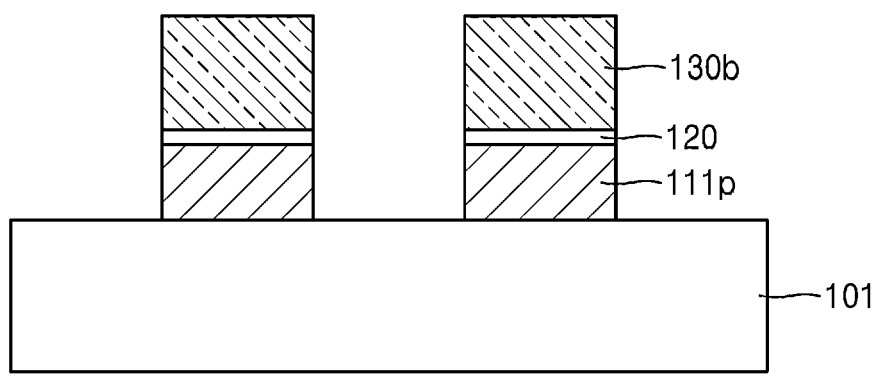

Referring to FIGS. 10A and 11J, a micropattern 111p may be formed by patterning the etched layer 111 by anisotropic etching by using the exposed portion 130b as an etching mask in operation S600. At this time, the exposed antireflection layer 120 may be removed. The etched layer 111 may be patterned by a plasma etching method, a reactive ion etching (ME) method, or an ion beam etching method and the inventive concept is not limited thereto.

Then, the exposed portion 130b and the antireflection layer 120 on the micropattern 111p are removed and the micropattern 111p may be finally obtained. The micropattern 111p may have a width of about 5 nm to about 20 nm. In some embodiments, the micropattern 111p may have a width of about 3 nm to about 20 nm.

The micropattern 111p obtained after etching the etched layer 111 may configure various elements required for implementing an integrated circuit device. For example, the micropattern 111p may be an active region defined in a substrate of a semiconductor device. In another example, the micropattern 111p may include a plurality of contact hole patterns or line and space patterns. In another example, the micropattern 111p may include a conductive pattern or an insulating pattern. For example, the conductive pattern may comprise a plurality of bit line forming patterns, a plurality of direct contact forming patterns, a plurality of buried contact forming patterns, and a plurality of capacitor lower electrode forming patterns arranged in a cell array region of the integrated circuit device or a plurality of conductive patterns arranged in a core region of the integrated circuit device.

By using the substrate processing method and the micropattern forming method using the substrate processing apparatus according to the inventive concept, a micropattern having a smooth pattern surface without embossing with remarkably reduced particle defect may be formed without fear of collapse.

Figure 12:
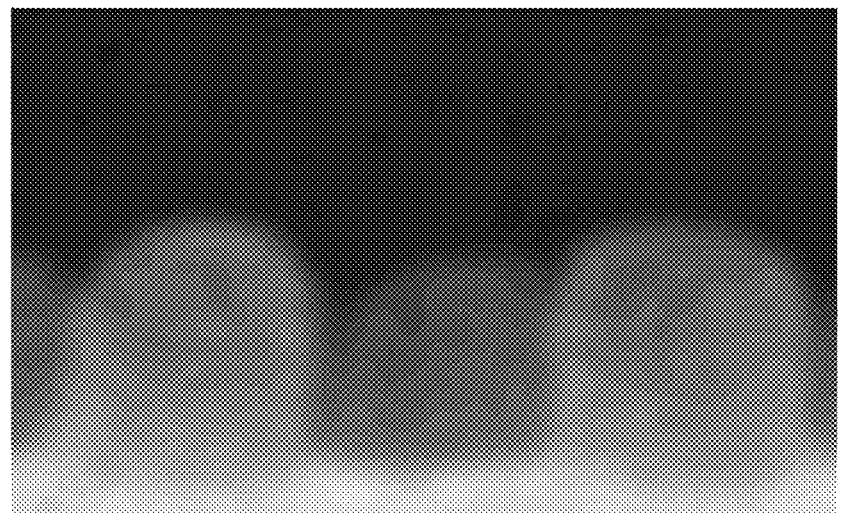
FIGS. 12 and 14 are scanning electron microscope (SEM) images obtained by capturing a surface of a micropattern after removing developer by using gaseous carbon dioxide ($CO_2$)
Figure 13:
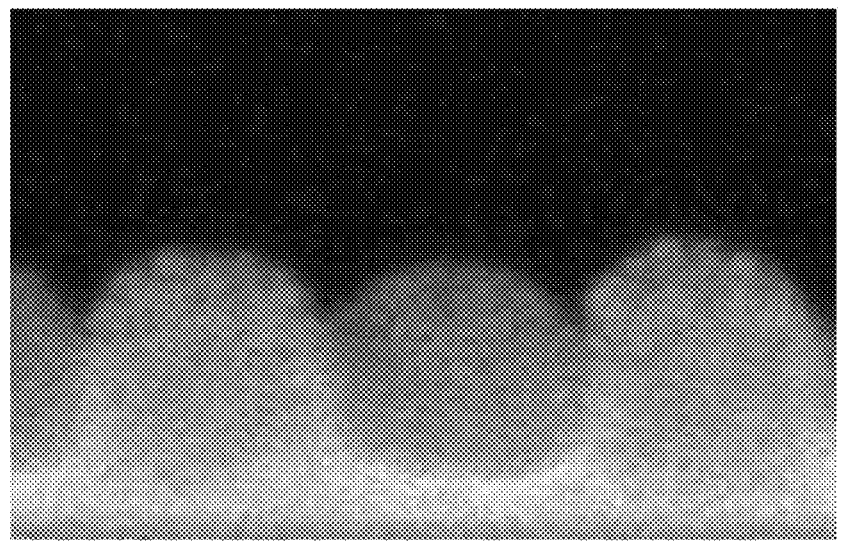
FIGS. 13 and 15 are SEM images obtained by capturing a surface of a micropattern after removing developer by using supercritical $CO_2$.
Figure 14:
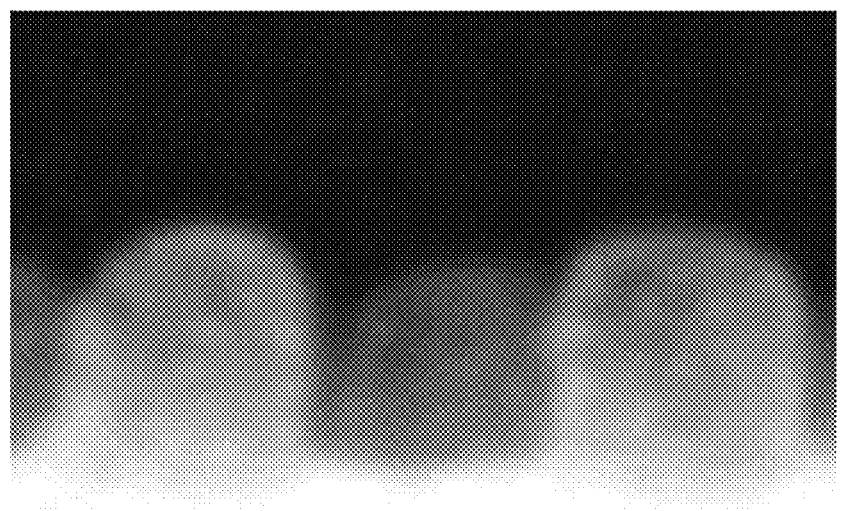
Figure 15:
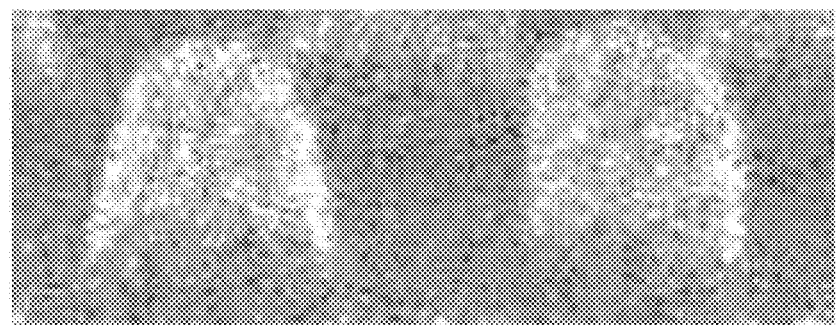

FIGS. 12 and 14 are scanning electron microscope (SEM) images obtained by capturing a surface of a micropattern after removing developer by using gaseous carbon dioxide ($CO_2$) and FIGS. 13 and 15 are SEM images obtained by capturing a surface of a micropattern after removing developer by using supercritical $CO_2$.

It is observed that rough embossing is formed on surfaces of the pattern images illustrated in FIGS. 13 and 15. The rough embossing is generated by partial materials in EUV photoresist eluting to the outside of the patterns by solvent power of supercritical $CO_2$ as supercritical $CO_2$ with strong solvent power is used.

On the other hand, it is observed that the pattern images illustrated in FIGS. 12 and 14 have smooth surfaces.

While the inventive concept has been particularly shown and described with reference to embodiments thereof, it will be understood that various changes in form and details may be made therein without departing from the scope of the following claims.

What is claimed is:

1. A substrate processing method comprising:
providing a surface tension reducing agent as a gas onto a substrate positioned within a processing chamber, the substrate comprising an exposed photoresist layer and a layer of developer on the exposed photoresist layer, wherein the providing the surface tension reducing agent comprises one or more of the following: changing a pressure of the surface tension reducing agent in the processing chamber in one or more steps, changing the pressure of the surface tension reducing agent in the processing chamber in one or more pulses, increasing and then maintaining the pressure of the surface tension reducing agent in the processing chamber; and
causing a bulk flow of the developer to remove the developer from the substrate.

2. The substrate processing method of claim 1, wherein the surface tension reducing agent is selected from a group consisting of $CO_2$, aliphatic hydrocarbon with 1 to 4 carbon atoms, $H_2$, and $SO_2$.

3. The substrate processing method of claim 2, wherein the developer comprises n-butyl acetate (nBA) and the surface tension reducing agent comprises gaseous $CO_2$.

4. The substrate processing method of claim 1, wherein
a temperature of the surface tension reducing agent within the processing chamber is lower than a critical temperature of the surface tension reducing agent or a pressure of the surface tension reducing agent within the processing chamber is lower than a critical pressure of the surface tension reducing agent.

5. The substrate processing method of claim 1, wherein
a temperature of the surface tension reducing agent within the processing chamber is lower than a critical temperature of the surface tension reducing agent and a pressure of the surface tension reducing agent within the processing chamber is lower than a critical pressure of the surface tension reducing agent.

6. The substrate processing method of claim 1, wherein
a temperature of the surface tension reducing agent within the processing chamber is about −20° C. to about 100° C. and a pressure of the surface tension reducing agent within the processing chamber is about 1.05 bar to about 3 bar in absolute pressure.

7. The substrate processing method of claim 1, wherein the providing the surface tension reducing agent at least partially occurs at a same time as the causing the bulk flow of the developer.

8. The substrate processing method of claim 1, wherein the providing the surface tension reducing agent comprises supplying the surface tension reducing agent in a plurality of pulses, and
wherein a discharge port is repeatedly opened and closed to correspond with the plurality of pulses so that the bulk flow is maximized.

9. The substrate processing method of claim 1, wherein a position where the surface tension reducing agent is provided onto the substrate changes over time.

10. The substrate processing method of claim 9, wherein the substrate rotates as the surface tension reducing agent is provided onto the substrate.

11. A substrate processing method comprising:
providing a surface tension reducing agent as a gas onto developer in a processing chamber;
dipping a substrate having an exposed photoresist layer in the developer; and
removing the substrate from the developer such that a main surface of the substrate is perpendicular to a free surface of the developer,
wherein the providing the surface tension reducing agent at least partially occurs at a same time with the dipping the substrate having the exposed photoresist layer in the developer and the removing the substrate from the developer.

12. A micropattern forming method comprising:
forming a to-be-etched layer and an antireflection layer on a substrate;
forming an extreme ultraviolet (EUV) photoresist layer on the substrate;
exposing the EUV photoresist layer to EUV irradiation using an exposure mask;
providing a layer of developer onto the exposed EUV photoresist layer and moving the substrate into a processing chamber;
providing a surface tension reducing agent as a gas into the processing chamber, comprising supplying the surface tension reducing agent in a plurality of pulses;
causing a bulk flow of the developer to remove the developer from the substrate and to form a photoresist pattern;
opening a discharge port of the processing chamber and discharging the developer removed from the substrate, wherein the discharge port is repeatedly opened and closed to correspond with the plurality of pulses so that the bulk flow is maximized;
transferring the substrate into an etching chamber; and
etching the to-be-etched layer using the photoresist pattern as an etching mask.

13. The micropattern forming method of claim 12,
wherein the providing the surface tension reducing agent at least partially occurs at a same time as the causing the bulk flow of the developer, and
wherein, the providing of the surface tension reducing agent comprises providing the surface tension reducing agent into the developer.

14. The micropattern forming method of claim 13,
wherein a temperature of the processing chamber in which the providing the surface tension reducing agent is performed is about 0° C. to about 80° C. and a pressure of the processing chamber is about 1.05 bar to about 3 bar in absolute pressure.

15. The micropattern forming method of claim 14,
wherein a temperature of the processing chamber is about 30° C. to about 65° C. and a pressure of the processing chamber is about 1.05 bar to about 2.2 bar in absolute pressure.

16. The micropattern forming method of claim 12,
wherein a pattern having a width of about 3 nm to about 20 nm is formed in the etching the to-be-etched layer.

17. The micropattern forming method of claim 12,
wherein the developer comprises n-butyl acetate (nBA) and the surface tension reducing agent comprises gaseous $CO_2$, and
wherein a portion of the EUV photoresist layer that is not exposed to EUV is removed by the nBA.

* * * * *